(12) United States Patent
Jacobson et al.

(10) Patent No.: US 9,293,511 B2
(45) Date of Patent: Mar. 22, 2016

(54) METHODS FOR ACHIEVING IMPROVED COLOR IN MICROENCAPSULATED ELECTROPHORETIC DEVICES

(75) Inventors: Joseph M. Jacobson, Newton Centre, MA (US); Ian D. Morrison, Acton, MA (US); Russell J. Wilcox, Natick, MA (US); Paul Drzaic, Lexington, MA (US)

(73) Assignee: E Ink Corporation, Billerica, MA (US)

( * ) Notice: Subject to any disclaimer, the term of this patent is extended or adjusted under 35 U.S.C. 154(b) by 1516 days.

(21) Appl. No.: 12/609,158

(22) Filed: Oct. 30, 2009

(65) Prior Publication Data

US 2010/0103502 A1 Apr. 29, 2010

Related U.S. Application Data

(63) Continuation of application No. 10/817,464, filed on Apr. 2, 2004, now Pat. No. 7,667,684, which is a continuation of application No. 09/349,806, filed on Jul. 8, 1999, now abandoned.

(60) Provisional application No. 60/092,050, filed on Jul. 8, 1998.

(51) Int. Cl.
*B05D 5/06* (2006.01)
*H01L 27/28* (2006.01)
(Continued)

(52) U.S. Cl.
CPC .............. *H01L 27/28* (2013.01); *B41J 3/4073* (2013.01); *B41J 3/4076* (2013.01); *G02B 26/026* (2013.01);
(Continued)

(58) Field of Classification Search
USPC .................. 427/58, 64; 345/107; 359/296
See application file for complete search history.

(56) References Cited

U.S. PATENT DOCUMENTS

| | | |
|---|---|---|
| 3,036,388 A | 5/1962 | Tate |
| 3,384,488 A | 5/1968 | Tulagin et al. |
| 3,406,363 A | 10/1968 | Tate |
| 3,460,248 A | 8/1969 | Tate |
| 3,585,381 A | 6/1971 | Hodson et al. |
| 3,612,758 A | 10/1971 | Evans et al. |
| 3,668,106 A | 6/1972 | Ota |
| 3,670,323 A | 6/1972 | Sobel et al. |
| 3,756,693 A | 9/1973 | Ota |

(Continued)

FOREIGN PATENT DOCUMENTS

| | | |
|---|---|---|
| DE | 195 00 694 | 8/1996 |
| EP | 0 281 204 A2 | 9/1988 |

(Continued)

OTHER PUBLICATIONS

Amundson, K., "Electrophoretic Imaging Films for Electronic Paper Displays" in Crawford G. ed. Flexible Flat Panel Displays, John Wiley & Sons, Ltd., Hoboken, NJ: 2005.

(Continued)

*Primary Examiner* — Brian K Talbot
(74) *Attorney, Agent, or Firm* — David J. Cole

(57) ABSTRACT

A method for manufacturing a full color, reflective display includes the steps of depositing a first plurality of electrophoretic display elements in substantial registration with a first electrode and a second plurality of electrophoretic display elements in substantial registration with a second electrode. The electrophoretic display elements include a capsule containing a species of particles dispersed in a suspending fluid. The selective deposition of the display elements can be achieved by ink-jet printing methods, screen printing methods or other printing methods. In some embodiments the electrodes are printed onto the substrate before selective deposition of the display elements, while in other embodiments the substrate is provided having the electrodes already disposed on it. In still other embodiments, the sequence of printing of electrodes and electrophoretic display elements can be varied.

14 Claims, 12 Drawing Sheets

(51) Int. Cl.
*B41J 3/407* (2006.01)
*G02B 26/02* (2006.01)
*G09F 9/302* (2006.01)
*G09F 9/37* (2006.01)
*G02F 1/1333* (2006.01)
*G02F 1/1334* (2006.01)
*G02F 1/167* (2006.01)
*H01L 51/00* (2006.01)
*H01L 51/05* (2006.01)

(52) U.S. Cl.
CPC ............... *G09F 9/302* (2013.01); *G09F 9/372* (2013.01); *B05D 5/06* (2013.01); *G02F 1/1334* (2013.01); *G02F 1/133305* (2013.01); *G02F 1/167* (2013.01); *G02F 2202/28* (2013.01); *H01L 51/005* (2013.01); *H01L 51/0077* (2013.01); *H01L 51/0512* (2013.01)

(56) References Cited

U.S. PATENT DOCUMENTS

| | | |
|---|---|---|
| 3,767,392 A | 10/1973 | Ota |
| 3,772,013 A | 11/1973 | Wells |
| 3,792,308 A | 2/1974 | Ota |
| 3,850,627 A | 11/1974 | Wells et al. |
| 3,870,517 A | 3/1975 | Ota et al. |
| 3,885,964 A | 5/1975 | Nacci |
| 3,892,568 A | 7/1975 | Ota |
| 4,041,481 A | 8/1977 | Sato |
| 4,045,327 A | 8/1977 | Noma et al. |
| 4,062,009 A | 12/1977 | Raverdy et al. |
| 4,068,927 A | 1/1978 | White |
| 4,071,430 A | 1/1978 | Liebert |
| 4,088,395 A | 5/1978 | Gigila |
| 4,093,534 A | 6/1978 | Carter et al. |
| 4,123,346 A | 10/1978 | Ploix |
| 4,126,528 A | 11/1978 | Chiang |
| 4,126,854 A | 11/1978 | Sheridon |
| 4,143,472 A | 3/1979 | Murata et al. |
| 4,147,932 A | 4/1979 | Lewis |
| 4,149,149 A | 4/1979 | Miki et al. |
| 4,203,106 A | 5/1980 | Dalisa et al. |
| 4,211,668 A | 7/1980 | Tate |
| 4,218,302 A | 8/1980 | Dalisa et al. |
| 4,231,641 A | 11/1980 | Randin |
| 4,261,653 A | 4/1981 | Goodrich |
| 4,272,596 A | 6/1981 | Harbour et al. |
| 4,298,448 A | 11/1981 | Muller et al. |
| 4,305,807 A | 12/1981 | Somlyody |
| 4,311,361 A | 1/1982 | Somlyody |
| 4,314,013 A | 2/1982 | Chang |
| 4,324,456 A | 4/1982 | Dalisa |
| 4,390,403 A | 6/1983 | Batchelder |
| 4,418,346 A | 11/1983 | Batchelder |
| 4,419,663 A | 12/1983 | Kohashi |
| 4,430,648 A | 2/1984 | Togashi et al. |
| 4,435,047 A | 3/1984 | Fergason |
| 4,438,160 A | 3/1984 | Ishikawa et al. |
| 4,450,440 A | 5/1984 | White |
| 4,522,472 A | 6/1985 | Liebert et al. |
| 4,598,960 A | 7/1986 | DiSanto et al. |
| 4,643,528 A | 2/1987 | Bell, Jr. |
| 4,648,956 A | 3/1987 | Marshall et al. |
| 4,655,897 A | 4/1987 | DiSanto et al. |
| 4,732,830 A | 3/1988 | DiSanto et al. |
| 4,742,345 A | 5/1988 | Di Santo et al. |
| 4,748,366 A | 5/1988 | Taylor |
| 4,772,102 A | 9/1988 | Fergason et al. |
| 4,772,820 A | 9/1988 | DiSanto et al. |
| 4,776,675 A | 10/1988 | Takaochi et al. |
| 4,794,390 A | 12/1988 | Lippman |
| 4,824,208 A | 4/1989 | Fergason et al. |
| 4,828,617 A | 5/1989 | Csillag et al. |
| 4,832,458 A | 5/1989 | Fergason et al. |
| 4,850,919 A | 7/1989 | DiSanto et al. |
| 4,892,607 A | 1/1990 | DiSanto et al. |
| 4,909,959 A | 3/1990 | Lemaire et al. |
| 4,919,521 A | 4/1990 | Tada et al. |
| 4,947,219 A | 8/1990 | Boehm |
| 5,006,212 A | 4/1991 | DiSanto et al. |
| 5,016,002 A | 5/1991 | Levanto |
| 5,017,225 A | 5/1991 | Nakanishi et al. |
| 5,028,841 A | 7/1991 | DiSanto et al. |
| 5,041,824 A | 8/1991 | DiSanto et al. |
| 5,053,763 A | 10/1991 | DiSanto et al. |
| 5,057,363 A | 10/1991 | Nakanishi |
| 5,066,105 A | 11/1991 | Yoshimoto et al. |
| 5,066,946 A | 11/1991 | Disanto et al. |
| 5,070,326 A | 12/1991 | Yoshimoto et al. |
| 5,077,157 A | 12/1991 | DiSanto et al. |
| 5,082,351 A | 1/1992 | Fergason |
| 5,105,185 A | 4/1992 | Nakanowatari et al. |
| 5,119,218 A | 6/1992 | Yoshimoto et al. |
| 5,128,785 A | 7/1992 | Yoshimoto et al. |
| 5,138,472 A | 8/1992 | Jones et al. |
| 5,151,032 A | 9/1992 | Igawa |
| 5,161,007 A | 11/1992 | Takanashi et al. |
| 5,174,882 A | 12/1992 | DiSanto et al. |
| 5,177,476 A | 1/1993 | DiSanto et al. |
| 5,185,226 A | 2/1993 | Grosso et al. |
| 5,187,609 A | 2/1993 | DiSanto et al. |
| 5,204,424 A | 4/1993 | Roncali et al. |
| 5,208,686 A * | 5/1993 | Fergason ................... 349/79 |
| 5,213,983 A | 5/1993 | Gustafsson et al. |
| 5,216,416 A | 6/1993 | DiSanto et al. |
| 5,220,316 A | 6/1993 | Kazan |
| 5,223,115 A | 6/1993 | DiSanto et al. |
| 5,223,823 A | 6/1993 | Disanto et al. |
| 5,250,932 A | 10/1993 | Yoshimoto et al. |
| 5,250,938 A | 10/1993 | DiSanto et al. |
| 5,254,981 A | 10/1993 | Disanto et al. |
| 5,266,934 A | 11/1993 | Van Almen |
| 5,266,937 A | 11/1993 | DiSanto et al. |
| 5,276,438 A | 1/1994 | DiSanto et al. |
| 5,279,511 A | 1/1994 | DiSanto et al. |
| 5,279,694 A | 1/1994 | DiSanto et al. |
| 5,293,528 A | 3/1994 | DiSanto et al. |
| 5,298,833 A | 3/1994 | Hou |
| 5,302,235 A | 4/1994 | DiSanto et al. |
| 5,303,073 A | 4/1994 | Shirota et al. |
| 5,304,439 A | 4/1994 | Disanto et al. |
| 5,315,312 A | 5/1994 | DiSanto et al. |
| 5,345,251 A | 9/1994 | DiSanto et al. |
| 5,345,322 A | 9/1994 | Fergason |
| 5,359,346 A | 10/1994 | DiSanto et al. |
| 5,380,362 A | 1/1995 | Schubert |
| 5,389,945 A | 2/1995 | Sheridon |
| 5,402,145 A | 3/1995 | Disanto et al. |
| 5,403,518 A | 4/1995 | Schubert |
| 5,411,398 A | 5/1995 | Nakanishi et al. |
| 5,411,656 A | 5/1995 | Schubert |
| 5,412,398 A | 5/1995 | DiSanto et al. |
| 5,421,926 A | 6/1995 | Yukinobu et al. |
| 5,460,688 A | 10/1995 | DiSanto et al. |
| 5,463,492 A | 10/1995 | Check, III |
| 5,467,107 A | 11/1995 | DiSanto et al. |
| 5,508,720 A | 4/1996 | DiSanto et al. |
| 5,512,162 A | 4/1996 | Sachs et al. |
| 5,543,219 A | 8/1996 | Elwakil |
| 5,543,589 A | 8/1996 | Buchana et al. |
| 5,561,443 A | 10/1996 | Disanto et al. |
| 5,565,885 A | 10/1996 | Tamanoi |
| 5,573,711 A | 11/1996 | Hou et al. |
| 5,575,554 A | 11/1996 | Guritz |
| 5,582,700 A * | 12/1996 | Bryning et al. ............ 204/450 |
| 5,604,027 A | 2/1997 | Sheridon |
| 5,627,561 A | 5/1997 | Laspina et al. |
| 5,635,317 A | 6/1997 | Taniguchi et al. |
| 5,643,673 A | 7/1997 | Hou |
| 5,650,872 A | 7/1997 | Saxe et al. |
| 5,679,821 A | 10/1997 | Takei et al. |
| 5,684,501 A | 11/1997 | Knapp et al. |
| 5,686,383 A | 11/1997 | Long et al. |

(56) References Cited

U.S. PATENT DOCUMENTS

| | | |
|---|---|---|
| 5,689,282 A | 11/1997 | Wolfs et al. |
| 5,695,346 A | 12/1997 | Sekiguchi et al. |
| 5,707,738 A | 1/1998 | Hou |
| 5,707,747 A | 1/1998 | Tomiyama et al. |
| 5,708,525 A | 1/1998 | Sheridon |
| 5,709,976 A | 1/1998 | Malhotra |
| 5,714,051 A | 2/1998 | Van Leth et al. |
| 5,716,550 A | 2/1998 | Gardner et al. |
| 5,717,283 A * | 2/1998 | Biegelsen et al. ............. 313/483 |
| 5,717,514 A | 2/1998 | Sheridon |
| 5,717,515 A | 2/1998 | Sheridon |
| 5,721,042 A | 2/1998 | Iijima et al. |
| 5,725,935 A | 3/1998 | Rajan |
| 5,731,116 A | 3/1998 | Matsuo et al. |
| 5,737,115 A | 4/1998 | Mackinlay et al. |
| 5,738,977 A | 4/1998 | Van Der Sluis-Van Der Voort et al. |
| 5,739,801 A | 4/1998 | Sheridon |
| 5,744,283 A | 4/1998 | Spierings et al. |
| 5,745,094 A | 4/1998 | Gordon, II et al. |
| 5,750,238 A | 5/1998 | Iijima et al. |
| 5,751,268 A | 5/1998 | Sheridon |
| 5,754,332 A | 5/1998 | Crowley |
| 5,759,671 A | 6/1998 | Tanaka et al. |
| 5,760,761 A | 6/1998 | Sheridon |
| 5,767,826 A | 6/1998 | Sheridon et al. |
| 5,777,782 A | 7/1998 | Sheridon |
| 5,786,875 A | 7/1998 | Brader et al. |
| 5,789,487 A | 8/1998 | Matyjaszewski et al. |
| 5,808,783 A | 9/1998 | Crowley |
| 5,825,529 A | 10/1998 | Crowley |
| 5,828,432 A | 10/1998 | Shashidhar et al. |
| 5,835,577 A | 11/1998 | Disanto et al. |
| 5,843,259 A | 12/1998 | Narang et al. |
| 5,852,427 A | 12/1998 | Buzak |
| 5,872,552 A * | 2/1999 | Gordon et al. ................ 345/107 |
| 5,894,367 A | 4/1999 | Sheridon |
| 5,898,416 A | 4/1999 | Kuijk et al. |
| 5,900,858 A | 5/1999 | Richley |
| 5,912,283 A | 6/1999 | Hashizume et al. |
| 5,930,026 A | 7/1999 | Jacobson et al. |
| 5,961,804 A | 10/1999 | Jacobson et al. |
| 5,975,680 A | 11/1999 | Wen et al. |
| 6,017,584 A | 1/2000 | Albert et al. |
| 6,054,071 A | 4/2000 | Mikkelsen, Jr. |
| 6,055,091 A | 4/2000 | Sheridon et al. |
| 6,055,180 A | 4/2000 | Gudesen et al. |
| 6,067,185 A | 5/2000 | Albert et al. |
| 6,097,531 A | 8/2000 | Sheridon |
| 6,118,426 A | 9/2000 | Albert et al. |
| 6,120,588 A | 9/2000 | Jacobson |
| 6,120,839 A | 9/2000 | Comiskey et al. |
| 6,124,851 A | 9/2000 | Jacobson |
| 6,128,124 A | 10/2000 | Silverman |
| 6,130,773 A | 10/2000 | Jacobson et al. |
| 6,130,774 A | 10/2000 | Albert et al. |
| 6,137,467 A | 10/2000 | Sheridon et al. |
| 6,144,361 A | 11/2000 | Gordon, II et al. |
| 6,147,791 A | 11/2000 | Sheridon |
| 6,166,711 A | 12/2000 | Odake |
| 6,172,798 B1 | 1/2001 | Albert et al. |
| 6,177,921 B1 | 1/2001 | Comiskey et al. |
| 6,184,856 B1 | 2/2001 | Gordon, II et al. |
| 6,225,971 B1 | 5/2001 | Gordon, II et al. |
| 6,232,950 B1 | 5/2001 | Albert et al. |
| 6,236,587 B1 | 5/2001 | Gudesen et al. |
| 6,241,921 B1 | 6/2001 | Jacobson et al. |
| 6,249,271 B1 | 6/2001 | Albert et al. |
| 6,252,564 B1 | 6/2001 | Albert et al. |
| 6,262,706 B1 | 7/2001 | Albert et al. |
| 6,262,833 B1 | 7/2001 | Loxley et al. |
| 6,271,823 B1 | 8/2001 | Gordon, II et al. |
| 6,300,932 B1 | 10/2001 | Albert |
| 6,301,038 B1 | 10/2001 | Fitzmaurice et al. |
| 6,312,304 B1 | 11/2001 | Duthaler et al. |
| 6,312,971 B1 | 11/2001 | Amundson et al. |
| 6,323,989 B1 | 11/2001 | Jacobson et al. |
| 6,327,072 B1 | 12/2001 | Comiskey et al. |
| 6,343,164 B1 | 1/2002 | Robertsson et al. |
| 6,376,828 B1 | 4/2002 | Comiskey |
| 6,377,387 B1 | 4/2002 | Duthaler et al. |
| 6,392,785 B1 | 5/2002 | Albert et al. |
| 6,392,786 B1 | 5/2002 | Albert |
| 6,404,339 B1 * | 6/2002 | Eberhardt .................. 340/572.1 |
| 6,413,790 B1 | 7/2002 | Duthaler et al. |
| 6,422,687 B1 | 7/2002 | Jacobson |
| 6,445,374 B2 | 9/2002 | Albert et al. |
| 6,445,489 B1 | 9/2002 | Jacobson et al. |
| 6,459,418 B1 | 10/2002 | Comiskey et al. |
| 6,473,072 B1 | 10/2002 | Comiskey et al. |
| 6,480,182 B2 | 11/2002 | Turner et al. |
| 6,498,114 B1 | 12/2002 | Amundson et al. |
| 6,504,524 B1 | 1/2003 | Gates et al. |
| 6,506,438 B2 | 1/2003 | Duthaler et al. |
| 6,512,354 B2 | 1/2003 | Jacobson et al. |
| 6,515,649 B1 | 2/2003 | Albert et al. |
| 6,518,949 B2 | 2/2003 | Drzaic |
| 6,521,489 B2 | 2/2003 | Duthaler et al. |
| 6,531,997 B1 | 3/2003 | Gates et al. |
| 6,535,197 B1 | 3/2003 | Comiskey et al. |
| 6,538,801 B2 | 3/2003 | Jacobson et al. |
| 6,545,291 B1 | 4/2003 | Amundson et al. |
| 6,580,545 B2 | 6/2003 | Morrison et al. |
| 6,628,258 B1 | 9/2003 | Nakamura |
| 6,639,578 B1 | 10/2003 | Comiskey et al. |
| 6,652,075 B2 | 11/2003 | Jacobson |
| 6,657,772 B2 | 12/2003 | Loxley |
| 6,664,944 B1 | 12/2003 | Albert et al. |
| 6,670,659 B1 | 12/2003 | Leistad et al. |
| D485,294 S | 1/2004 | Albert |
| 6,672,921 B1 | 1/2004 | Liang et al. |
| 6,680,725 B1 | 1/2004 | Jacobson |
| 6,683,333 B2 | 1/2004 | Kazlas et al. |
| 6,693,620 B1 | 2/2004 | Herb et al. |
| 6,704,133 B2 | 3/2004 | Gates et al. |
| 6,710,540 B1 | 3/2004 | Albert et al. |
| 6,721,083 B2 | 4/2004 | Jacobson et al. |
| 6,724,519 B1 | 4/2004 | Morrison et al. |
| 6,727,881 B1 | 4/2004 | Albert et al. |
| 6,727,882 B1 | 4/2004 | Large et al. |
| 6,738,050 B2 | 5/2004 | Comiskey et al. |
| 6,750,473 B2 | 6/2004 | Amundson et al. |
| 6,753,999 B2 | 6/2004 | Zehner et al. |
| 6,788,449 B2 | 9/2004 | Liang et al. |
| 6,816,147 B2 | 11/2004 | Albert |
| 6,819,471 B2 | 11/2004 | Amundson et al. |
| 6,822,782 B2 | 11/2004 | Pratt et al. |
| 6,825,068 B2 | 11/2004 | Denis et al. |
| 6,825,829 B1 | 11/2004 | Albert et al. |
| 6,825,970 B2 | 11/2004 | Goenaga et al. |
| 6,831,769 B2 | 12/2004 | Holman et al. |
| 6,839,158 B2 | 1/2005 | Albert et al. |
| 6,842,167 B2 | 1/2005 | Albert et al. |
| 6,842,279 B2 | 1/2005 | Amundson |
| 6,842,657 B1 | 1/2005 | Drzaic et al. |
| 6,864,875 B2 | 3/2005 | Drzaic et al. |
| 6,865,010 B2 | 3/2005 | Duthaler et al. |
| 6,866,760 B2 | 3/2005 | Paolini Jr. et al. |
| 6,870,657 B1 | 3/2005 | Fitzmaurice et al. |
| 6,870,661 B2 | 3/2005 | Pullen et al. |
| 6,900,851 B2 | 5/2005 | Morrison et al. |
| 6,922,276 B2 | 7/2005 | Zhang et al. |
| 6,950,220 B2 | 9/2005 | Abramson et al. |
| 6,958,848 B2 | 10/2005 | Cao et al. |
| 6,967,640 B2 | 11/2005 | Albert et al. |
| 6,980,196 B1 * | 12/2005 | Turner et al. .................. 345/107 |
| 6,982,178 B2 | 1/2006 | LeCain et al. |
| 6,987,603 B2 | 1/2006 | Paolini, Jr. et al. |
| 6,995,550 B2 | 2/2006 | Jacobson et al. |
| 7,002,728 B2 | 2/2006 | Pullen et al. |
| 7,012,600 B2 | 3/2006 | Zehner et al. |
| 7,012,735 B2 | 3/2006 | Honeyman et al. |
| 7,023,420 B2 | 4/2006 | Comiskey et al. |
| 7,030,412 B1 | 4/2006 | Drzaic et al. |

(56) References Cited

U.S. PATENT DOCUMENTS

| | | | |
|---|---|---|---|
| 7,030,854 | B2 | 4/2006 | Baucom et al. |
| 7,034,783 | B2 | 4/2006 | Gates et al. |
| 7,038,655 | B2 | 5/2006 | Herb et al. |
| 7,061,663 | B2 | 6/2006 | Cao et al. |
| 7,071,913 | B2 | 7/2006 | Albert et al. |
| 7,075,502 | B1 | 7/2006 | Drzaic et al. |
| 7,075,703 | B2 | 7/2006 | O'Neil et al. |
| 7,079,305 | B2 | 7/2006 | Paolini, Jr. et al. |
| 7,106,296 | B1 | 9/2006 | Jacobson |
| 7,109,968 | B2 | 9/2006 | Albert et al. |
| 7,110,163 | B2 | 9/2006 | Webber et al. |
| 7,110,164 | B2 | 9/2006 | Paolini, Jr. et al. |
| 7,116,318 | B2 | 10/2006 | Amundson et al. |
| 7,116,466 | B2 | 10/2006 | Whitesides et al. |
| 7,119,759 | B2 | 10/2006 | Zehner et al. |
| 7,119,772 | B2 | 10/2006 | Amundson et al. |
| 7,148,128 | B2 | 12/2006 | Jacobson |
| 7,167,155 | B1 | 1/2007 | Albert et al. |
| 7,170,670 | B2 | 1/2007 | Webber |
| 7,173,752 | B2 | 2/2007 | Doshi et al. |
| 7,176,880 | B2 | 2/2007 | Amundson et al. |
| 7,180,649 | B2 | 2/2007 | Morrison et al. |
| 7,190,008 | B2 | 3/2007 | Amundson et al. |
| 7,193,625 | B2 | 3/2007 | Danner et al. |
| 7,202,847 | B2 | 4/2007 | Gates |
| 7,202,991 | B2 | 4/2007 | Zhang et al. |
| 7,206,119 | B2 | 4/2007 | Honeyman et al. |
| 7,223,672 | B2 | 5/2007 | Kazlas et al. |
| 7,230,750 | B2 | 6/2007 | Whitesides et al. |
| 7,230,751 | B2 | 6/2007 | Whitesides et al. |
| 7,236,290 | B1 | 6/2007 | Zhang et al. |
| 7,236,291 | B2 | 6/2007 | Kaga et al. |
| 7,236,292 | B2 | 6/2007 | LeCain et al. |
| 7,242,513 | B2 | 7/2007 | Albert et al. |
| 7,247,379 | B2 | 7/2007 | Pullen et al. |
| 7,256,766 | B2 | 8/2007 | Albert et al. |
| 7,259,744 | B2 | 8/2007 | Arango et al. |
| 7,265,895 | B2 | 9/2007 | Miyazaki et al. |
| 7,280,094 | B2 | 10/2007 | Albert |
| 7,304,634 | B2 | 12/2007 | Albert et al. |
| 7,304,787 | B2 | 12/2007 | Whitesides et al. |
| 7,312,784 | B2 | 12/2007 | Baucom et al. |
| 7,312,794 | B2 | 12/2007 | Zehner et al. |
| 7,312,916 | B2 | 12/2007 | Pullen et al. |
| 7,321,459 | B2 | 1/2008 | Masuda et al. |
| 7,327,511 | B2 | 2/2008 | Whitesides et al. |
| 7,339,715 | B2 | 3/2008 | Webber et al. |
| 7,349,148 | B2 | 3/2008 | Doshi et al. |
| 7,352,353 | B2 | 4/2008 | Albert et al. |
| 7,365,394 | B2 | 4/2008 | Denis et al. |
| 7,365,733 | B2 | 4/2008 | Duthaler et al. |
| 7,375,875 | B2 | 5/2008 | Whitesides et al. |
| 7,382,363 | B2 | 6/2008 | Albert et al. |
| 7,388,572 | B2 | 6/2008 | Duthaler et al. |
| 7,391,555 | B2 | 6/2008 | Albert et al. |
| 7,411,719 | B2 | 8/2008 | Paolini, Jr. et al. |
| 7,411,720 | B2 | 8/2008 | Honeyman et al. |
| 7,420,549 | B2 | 9/2008 | Jacobson et al. |
| 7,436,577 | B2 | 10/2008 | Moriyama et al. |
| 7,442,587 | B2 | 10/2008 | Amundson et al. |
| 7,443,571 | B2 | 10/2008 | LeCain et al. |
| 7,453,445 | B2 | 11/2008 | Amundson |
| 7,492,339 | B2 | 2/2009 | Amundson |
| 7,492,497 | B2 | 2/2009 | Paolini, Jr. et al. |
| 7,513,813 | B2 | 4/2009 | Paolini, Jr. et al. |
| 7,528,822 | B2 | 5/2009 | Amundson et al. |
| 7,532,388 | B2 | 5/2009 | Whitesides et al. |
| 7,535,624 | B2 | 5/2009 | Amundson et al. |
| 7,545,358 | B2 | 6/2009 | Gates et al. |
| 7,551,346 | B2 | 6/2009 | Fazel et al. |
| 7,554,712 | B2 | 6/2009 | Patry et al. |
| 7,561,324 | B2 | 7/2009 | Duthaler et al. |
| 7,583,251 | B2 | 9/2009 | Arango et al. |
| 7,583,427 | B2 | 9/2009 | Danner et al. |
| 7,598,173 | B2 | 10/2009 | Ritenour et al. |
| 7,602,374 | B2 | 10/2009 | Zehner et al. |
| 7,605,799 | B2 | 10/2009 | Amundson et al. |
| 7,636,191 | B2 | 12/2009 | Duthaler |
| 7,649,666 | B2 | 1/2010 | Isobe et al. |
| 7,649,674 | B2 | 1/2010 | Danner et al. |
| 7,667,684 | B2 | 2/2010 | Jacobson et al. |
| 7,667,886 | B2 | 2/2010 | Danner et al. |
| 7,672,040 | B2 | 3/2010 | Sohn et al. |
| 7,679,599 | B2 | 3/2010 | Kawai |
| 7,679,814 | B2 | 3/2010 | Paolini, Jr. et al. |
| 7,688,297 | B2 | 3/2010 | Zehner et al. |
| 7,688,497 | B2 | 3/2010 | Danner et al. |
| 7,705,824 | B2 | 4/2010 | Baucom et al. |
| 7,728,811 | B2 | 6/2010 | Albert et al. |
| 7,729,039 | B2 | 6/2010 | LeCain et al. |
| 7,733,311 | B2 | 6/2010 | Amundson et al. |
| 7,733,335 | B2 | 6/2010 | Zehner et al. |
| 7,733,554 | B2 | 6/2010 | Danner et al. |
| 7,746,544 | B2 | 6/2010 | Comiskey et al. |
| 7,785,988 | B2 | 8/2010 | Amundson et al. |
| 7,787,169 | B2 | 8/2010 | Abramson et al. |
| 7,791,782 | B2 | 9/2010 | Paolini, Jr. et al. |
| 7,791,789 | B2 | 9/2010 | Albert et al. |
| 7,826,129 | B2 | 11/2010 | Wu et al. |
| 7,839,564 | B2 | 11/2010 | Whitesides et al. |
| 7,843,621 | B2 | 11/2010 | Danner et al. |
| 7,843,624 | B2 | 11/2010 | Danner et al. |
| 7,843,626 | B2 | 11/2010 | Amundson et al. |
| 7,848,006 | B2 | 12/2010 | Wilcox et al. |
| 7,848,007 | B2 | 12/2010 | Paolini, Jr. et al. |
| 7,859,637 | B2 | 12/2010 | Amundson et al. |
| 7,893,435 | B2 | 2/2011 | Kazlas et al. |
| 7,898,717 | B2 | 3/2011 | Patry et al. |
| 7,903,319 | B2 | 3/2011 | Honeyman et al. |
| 7,910,175 | B2 | 3/2011 | Webber et al. |
| 7,952,557 | B2 | 5/2011 | Amundson et al. |
| 7,952,790 | B2 | 5/2011 | Honeyman et al. |
| 7,956,841 | B2 | 6/2011 | Albert et al. |
| 7,957,053 | B2 | 6/2011 | Honeyman et al. |
| 7,986,450 | B2 | 7/2011 | Cao et al. |
| 7,999,787 | B2 | 8/2011 | Amundson et al. |
| 8,009,344 | B2 | 8/2011 | Danner et al. |
| 8,009,348 | B2 | 8/2011 | Zehner et al. |
| 8,018,640 | B2 | 9/2011 | Whitesides et al. |
| 8,027,081 | B2 | 9/2011 | Danner et al. |
| 8,034,209 | B2 | 10/2011 | Danner et al. |
| 8,035,611 | B2 | 10/2011 | Sakamoto |
| 8,035,886 | B2 | 10/2011 | Jacobson |
| 8,040,594 | B2 | 10/2011 | Paolini, Jr. et al. |
| 8,049,947 | B2 | 11/2011 | Danner et al. |
| 8,054,526 | B2 | 11/2011 | Bouchard |
| 8,064,962 | B2 | 11/2011 | Wilcox et al. |
| 8,068,272 | B2 | 11/2011 | Lecain et al. |
| 8,077,141 | B2 | 12/2011 | Duthaler et al. |
| 8,077,381 | B2 | 12/2011 | Lecain et al. |
| 8,089,453 | B2 | 1/2012 | Comiskey et al. |
| 8,098,418 | B2 | 1/2012 | Paolini, Jr. et al. |
| 8,115,729 | B2 | 2/2012 | Danner et al. |
| 8,125,501 | B2 | 2/2012 | Amundson et al. |
| 8,129,655 | B2 | 3/2012 | Jacobson et al. |
| 8,139,050 | B2 | 3/2012 | Jacobson et al. |
| 8,169,400 | B2 | 5/2012 | Shih |
| 2002/0060321 | A1 | 5/2002 | Kazlas et al. |
| 2002/0090980 | A1 | 7/2002 | Wilcox et al. |
| 2002/0171620 | A1 | 11/2002 | Gordon, II et al. |
| 2003/0102858 | A1 | 6/2003 | Jacobson et al. |
| 2004/0105036 | A1 | 6/2004 | Danner et al. |
| 2004/0119681 | A1 | 6/2004 | Albert et al. |
| 2004/0263947 | A1 | 12/2004 | Drzaic et al. |
| 2005/0012980 | A1 | 1/2005 | Wilcox et al. |
| 2005/0122284 | A1 | 6/2005 | Gates et al. |
| 2005/0122306 | A1 | 6/2005 | Wilcox et al. |
| 2005/0122563 | A1 | 6/2005 | Honeyman et al. |
| 2005/0156340 | A1 | 7/2005 | Valianatos et al. |
| 2005/0179642 | A1 | 8/2005 | Wilcox et al. |
| 2005/0253777 | A1 | 11/2005 | Zehner et al. |
| 2005/0259068 | A1 | 11/2005 | Nihei et al. |
| 2006/0007194 | A1 | 1/2006 | Verschueren et al. |
| 2006/0087479 | A1 | 4/2006 | Sakurai et al. |

(56) References Cited

U.S. PATENT DOCUMENTS

| | | |
|---|---|---|
| 2006/0087489 A1 | 4/2006 | Sakurai et al. |
| 2006/0087718 A1 | 4/2006 | Takagi et al. |
| 2006/0152474 A1 | 7/2006 | Saito et al. |
| 2006/0181504 A1 | 8/2006 | Kawai |
| 2006/0209008 A1 | 9/2006 | Nihei et al. |
| 2006/0214906 A1 | 9/2006 | Kobayashi et al. |
| 2006/0231401 A1 | 10/2006 | Sakurai et al. |
| 2006/0238488 A1 | 10/2006 | Nihei et al. |
| 2006/0263927 A1 | 11/2006 | Sakurai et al. |
| 2007/0013683 A1 | 1/2007 | Zhou et al. |
| 2007/0052757 A1 | 3/2007 | Jacobson |
| 2007/0091417 A1 | 4/2007 | Cao et al. |
| 2007/0091418 A1 | 4/2007 | Danner et al. |
| 2007/0097489 A1 | 5/2007 | Doshi et al. |
| 2007/0103427 A1 | 5/2007 | Zhou et al. |
| 2007/0195399 A1 | 8/2007 | Aylward et al. |
| 2007/0211002 A1 | 9/2007 | Zehner et al. |
| 2007/0285385 A1 | 12/2007 | Albert et al. |
| 2008/0024429 A1 | 1/2008 | Zehner |
| 2008/0024482 A1 | 1/2008 | Gates et al. |
| 2008/0043318 A1 | 2/2008 | Whitesides et al. |
| 2008/0048969 A1 | 2/2008 | Whitesides et al. |
| 2008/0048970 A1 | 2/2008 | Drzaic et al. |
| 2008/0054879 A1 | 3/2008 | LeCain et al. |
| 2008/0074730 A1 | 3/2008 | Cao et al. |
| 2008/0129667 A1 | 6/2008 | Zehner et al. |
| 2008/0130092 A1 | 6/2008 | Whitesides et al. |
| 2008/0136774 A1 | 6/2008 | Harris et al. |
| 2008/0150888 A1 | 6/2008 | Albert et al. |
| 2008/0218839 A1 | 9/2008 | Paolini et al. |
| 2008/0266245 A1 | 10/2008 | Wilcox et al. |
| 2008/0273132 A1 | 11/2008 | Hsu et al. |
| 2008/0291129 A1 | 11/2008 | Harris et al. |
| 2008/0309350 A1 | 12/2008 | Danner et al. |
| 2009/0004442 A1 | 1/2009 | Danner |
| 2009/0009852 A1 | 1/2009 | Honeyman et al. |
| 2009/0034057 A1 | 2/2009 | LeCain et al. |
| 2009/0046082 A1 | 2/2009 | Jacobson et al. |
| 2009/0122389 A1 | 5/2009 | Whitesides et al. |
| 2009/0174651 A1 | 7/2009 | Jacobson et al. |
| 2009/0179923 A1 | 7/2009 | Amundson et al. |
| 2009/0195568 A1 | 8/2009 | Sjodin |
| 2009/0237773 A1 | 9/2009 | Cao et al. |
| 2009/0256799 A1 | 10/2009 | Ohkami et al. |
| 2009/0315044 A1 | 12/2009 | Amundson et al. |
| 2009/0322721 A1 | 12/2009 | Zehner et al. |
| 2010/0044894 A1 | 2/2010 | Valianatos et al. |
| 2010/0045592 A1 | 2/2010 | Arango et al. |
| 2010/0103502 A1 | 4/2010 | Jacobson et al. |
| 2010/0118384 A1 | 5/2010 | Danner et al. |
| 2010/0148385 A1 | 6/2010 | Balko et al. |
| 2010/0156780 A1 | 6/2010 | Jacobson et al. |
| 2010/0201651 A1 | 8/2010 | Baucom et al. |
| 2010/0207073 A1 | 8/2010 | Comiskey et al. |
| 2010/0265239 A1 | 10/2010 | Amundson et al. |
| 2010/0283806 A1 | 11/2010 | Albert et al. |
| 2010/0289736 A1 | 11/2010 | Feick et al. |
| 2011/0012825 A1 | 1/2011 | Walls et al. |
| 2011/0026101 A1 | 2/2011 | Wu et al. |
| 2011/0032595 A1 | 2/2011 | Whitesides et al. |
| 2011/0069370 A1 | 3/2011 | Patry et al. |
| 2011/0075248 A1 | 3/2011 | LeCain et al. |
| 2011/0140744 A1 | 6/2011 | Kazlas et al. |
| 2011/0164301 A1 | 7/2011 | Paolini, Jr. et al. |
| 2011/0187683 A1 | 8/2011 | Wilcox et al. |
| 2011/0187684 A1 | 8/2011 | Amundson et al. |
| 2011/0187689 A1 | 8/2011 | Bishop |
| 2011/0193840 A1 | 8/2011 | Amundson |
| 2011/0193841 A1 | 8/2011 | Amundson et al. |
| 2011/0194045 A1 | 8/2011 | Amundson et al. |
| 2011/0195629 A1 | 8/2011 | Honeyman et al. |
| 2011/0199671 A1 | 8/2011 | Amundson et al. |
| 2011/0285754 A1 | 11/2011 | Harrington et al. |
| 2011/0286080 A1 | 11/2011 | Chen et al. |
| 2011/0286081 A1 | 11/2011 | Jacobson |
| 2011/0286082 A1 | 11/2011 | Danner et al. |
| 2011/0286086 A1 | 11/2011 | Danner et al. |
| 2011/0292319 A1 | 12/2011 | Cole |
| 2011/0292493 A1 | 12/2011 | Danner et al. |
| 2011/0292494 A1 | 12/2011 | Danner et al. |
| 2011/0297309 A1 | 12/2011 | Danner et al. |
| 2011/0310459 A1 | 12/2011 | Gates et al. |
| 2011/0310461 A1 | 12/2011 | Bouchard et al. |
| 2012/0008188 A1 | 1/2012 | Telfer et al. |
| 2012/0019898 A1 | 1/2012 | Paolini, Jr. et al. |
| 2012/0075687 A1 | 3/2012 | Paolini, Jr. et al. |
| 2012/0081779 A1 | 4/2012 | Paolini, Jr. et al. |
| 2012/0134009 A1 | 5/2012 | Paolini, Jr. et al. |

FOREIGN PATENT DOCUMENTS

| | | |
|---|---|---|
| EP | 0 404 545 A2 | 12/1990 |
| EP | 0 443 571 A2 | 8/1991 |
| EP | 0 709 713 A2 | 5/1996 |
| EP | 1 099 207 B1 | 3/2002 |
| EP | 1 145 072 B1 | 5/2003 |
| GB | 1 314 906 | 4/1973 |
| GB | 1 465 701 | 3/1977 |
| GB | 2 306 229 A | 4/1997 |
| JP | 53-073098 | 6/1978 |
| JP | 55-096922 A | 7/1980 |
| JP | 60-189731 A | 9/1985 |
| JP | 60-197565 A | 10/1985 |
| JP | 62-058222 A | 3/1987 |
| JP | 62-231930 A | 10/1987 |
| JP | 62-269124 A | 11/1987 |
| JP | 62-299824 A | 12/1987 |
| JP | 01-086117 A | 3/1989 |
| JP | 64-086116 | 3/1989 |
| JP | 01-142537 A | 6/1989 |
| JP | 01-177517 A | 7/1989 |
| JP | 01-248182 A | 10/1989 |
| JP | 01-267525 A | 10/1989 |
| JP | 02-223934 A | 9/1990 |
| JP | 02-223935 A | 9/1990 |
| JP | 02-223936 A | 9/1990 |
| JP | 02-284124 A | 11/1990 |
| JP | 02-284125 A | 11/1990 |
| JP | 04-345133 A | 12/1992 |
| JP | 05-061421 A | 3/1993 |
| JP | 05-165064 A | 6/1993 |
| JP | 05-173194 A | 7/1993 |
| JP | 05-307197 A | 11/1993 |
| JP | 06-202168 A | 7/1994 |
| JP | 07-036020 A | 2/1995 |
| JP | 08-234176 A | 9/1996 |
| JP | 09-006277 A | 1/1997 |
| JP | 09-031453 A | 2/1997 |
| JP | 09-185087 A | 7/1997 |
| JP | 09-211499 A | 8/1997 |
| JP | 09-230391 A | 9/1997 |
| JP | 10-048673 A | 2/1998 |
| JP | 10-149118 A | 6/1998 |
| JP | 10-161161 A | 6/1998 |
| WO | WO 82/02961 | 9/1982 |
| WO | WO 95/06307 | 3/1995 |
| WO | WO 95/33085 | 12/1995 |
| WO | WO 99/04631 | 2/1999 |
| WO | WO 99/20682 | 4/1999 |
| WO | WO 00/36560 | 6/2000 |
| WO | WO 00/38000 | 6/2000 |
| WO | WO 00/67110 | 11/2000 |
| WO | WO 01/07961 | 2/2001 |
| WO | WO 2004/099862 | 11/2004 |
| WO | WO 2011/146920 | 11/2011 |

OTHER PUBLICATIONS

Amundson, K., et al., "Flexible, Active-Matrix Display Constructed Using a Microencapsulated Electrophoretic Material and an Organic-Semiconductor-Based Backplane", SID 01 Digest, 160 (Jun. 2001).

Au, J. et al., "Ultra-Thin 3.1-in. Active-Matrix Electronic Ink Display for Mobile Devices", IDW'02, 223 (2002).

(56) References Cited

OTHER PUBLICATIONS

Bach, U., et al., "Nanomaterials-Based Electrochromics for Paper-Quality Displays", Adv. Mater, 14(11), 845 (2002).
Bao, Z. et al.., "High Performance Plastic Transistors Fabricated by Printing Techniques", Chem. Mater., 9, 1299 (1997).
Beilin, S., et al, "8.5: 2000-Character Electrophoretic Display", SID 86 Digest, 136 (1986).
Blazo, S.F., "High Resolution Electrophoretic Display with Photoconductor Addressing", SID Digest 1982, p. 152.
Bohnke et al., "Polymer-Based Solid Electrochromic Cell for Matrix-Addressable Display Devices." J. Electrochem. Soc., 138, 3612 (1991).
Boston Herald, "E Ink debuts in J.C. Penney Stores", May 3, 1999, p. 27.
Bouchard, A. et al., "High-Resolution Microencapsulated Electrophoretic Display on Silicon", SID 04 Digest, 651 (2004).
Caillot, E. et al. "Active Matrix Electrophoretic Information Display for High Performance Mobile Devices", IDMC Proceedings (2003).
Chen, Y., et al., "A Conformable Electronic Ink Display using a Foil-Based a-Si TFT Array", SID 01 Digest, 157 (Jun. 2001).
Chiang, A., "Conduction Mechanism of Charge Control Agents Used in Electrophoretic Display Devices", Proceeding of the S.I.D., 18, 275 (1977).
Comiskey, B., et al., "An electrophoretic ink for all-printed reflective electronic displays", Nature, 394, 253 (1998).
Comiskey, B., et al., "Electrophoretic Ink: A Printable Display Material", SID 97 Digest (1997), p. 75.
Croucher, M.D., et al., "Electrophoretic Display: Materials as Related to Performance", Photog. Sci. Eng., 25, 80 (1981).
Dalisa, A.L., "Electrophoretic Display Technology", IEEE Trans. Electron Dev., ED-24, 827 (1977).
Danner, G.M. et al., "Reliability Performance for Microencapsulated Electrophoretic Displays with Simulated Active Matrix Drive", SID 03 Digest, 573 (2003).
Drzaic, P., et al., "A Printed and Rollable Bistable Electronic Display", SID 98 Digest (1998), p. 1131.
Duthaler, G., et al., "Active-Matrix Color Displays Usiing Electrophoretic Ink and Color Filters", SID 02 Digest, 1374 (2002).
Egashira,. N., et al., "Solid electrochromic cell consisting of Lu-diphthalocyanine and lead fluoride", Proceedings of the SID, 28, 227 (1987).
Fitzhenry-Ritz, B., "Optical Properties of Electrophoretic Image Displays", Proceedings of the S.I.D., 22, 300 (1981).
Gates, H. et al., "A5 Sized Electronic Paper Display for Document Viewing", SID 05 Digest, (2005).
Goodman, L.A., Passive Liquid Displays: Liquid Crystals Electrophoretics and Electrochromics, Proceedings of S.I.D., 17, 30 (1976).
Gutcho, M.H., Microcapsules and Mlcroencapsulation Techniques, Noyes Data Corp., Park Ridge NJ, (1976).
Harbour, J.R., et al., "Subdivided electrophoretic display", Xerox Disclosure Journal, 4, 705 (1979).
Henzen, A. et al., "An Electronic Ink Low Latency Drawing Tablet", SID 04 Digest, 1070 (2004).
Henzen, A. et al., "Development of Active Matrix Electronic Ink Displays for Handheld Devices", SID 03 Digest, 176, (2003).
Henzen, A. et al., "Development of Active Matrix Electronic Ink Displays for Smart Handheld Applications", IDW'02, 227 (2002).
Hopper, M.A., et al., "An Electrophoretic Display, Its Properties and Addressing", IEEE Trans. Electron Dev., ED-26 1148 (1979).
Hosaka, H., et al., "Electromagnetic microrelays: concepts and fundamental characteristics", Sensors and Actuators A, 40, 41 (1994).
Jacobson, J., et al., "The last book", IBM Systems J., 36, 457 (1997).
Jo, G-R, et al., "Toner Display Based on Particle Movements", Chem. Mater, 14, 664 (2002).
Johnson, M. et al., "High Quality Images on Electronic Paper Displays", SID 05 Digest, 1666 (2005).
Kazlas, P et al., "Card size Active-matrix Electronic Ink Display", Eurodisplay 2002, 259 (2002).
Kazlas, P., et al., "12.1" SVGA Microencapsulated Electrophoretic Active Matrix Display for Information Applicances, SID 01 Digest, 152 (Jun. 2001).
Kimlin, Administrative Patent Judge; Full Color Reflective Display with Multichromatic Sub-Pixels; Mar. 24, 2004; 1-9; Decision on Appeal No. 2004-0103.
Kitamura, T., et al., "Electrical toner movement for electronic paper-like display", Asia Display/IDW '01, p. 1517, Paper HCS1-1 (2001).
Kornfeld, A Defect-Tolerent Active-Matrix Electrophoretic Display, SID Digest, 1984, p. 142.
Lee, L.L., "Fabrication of Magnetic Particles Displays", Proceedings of the SID, 18, 283 (1977).
Lewis et al., "Gravitational, Inter-Particle and Particle-Electrode Forces in the Electrophoretic Display", Proceedings of the SID, 18, 235 (1977).
Minnema, L., et al., "Pattern Generation in Polyimide Coatings and Its Application in an Electrophoretic Image Display", Polym. Eng. Sci., 28, 815 (1988).
Moesner, F.M., et al., "Devices for Particle Handling by an AC Electric Field", IEEE, 1995, p. 66.
Murau, P., "Characteristics of an X-Y Addressed Electrophoretic Image Display (EPID)," SID 84 Digest (1984) p. 141.
Murau, P., et al., "The understanding and elimination of some suspension instabilities in an electrophoretic display", J. Appl. Phys., 49, 4820 (1978).
Nakamura, E., et al., "Development of Electrophoretic Display Using Microcapsulated Suspension," SID 98 Digest (1998), p. 1014.
Negroponte, N., et al., "Surfaces and Displays," Wired, Jan. 1997, p. 212.
O'Regan, B. et al., "A Low Cost, High-efficiency Solar Cell Based on Dye-sensitized colloidal $TiO_2$ Films", Nature, vol. 353, Oct. 24, 1991, 773-740.
Ota, I., et al., "Developments in Electrophoretic Displays", Proceedings of the SID, 18, 243 (1977).
Ota, I., et al., "Electrophoretic display devices", Laser 75 Optoelectronics Conference Proceedings, 145 (1975).
Ota, I., et al., "Electrophoretic Image Display (EPID) Panel", Proceedings of the IEEE, 61, 832 (1973).
Pankovo "Color Reflection Type Display Panel", RCA Technical Notes, Mar. 1962, No. 535.
Pearlstein, "Electroless Plating", Lowenheim (ed.), Modern Electroplating, Wiley, New York (1976), pp. 710-747.
Pitt, M.G., et al., "Power Consumption of Microencapsulated Electrophoretic Displays for Smart Handheld Applications", SID 02 Digest, 1378 (2002).
Platt, C., "Digital Ink," Wired, May 1997, p. 162.
Poteate, Administrative Patent Judge; Full Color Reflective Display with Multichromatic Sub-Pixels; Sep. 26, 2003; 1-7; Decision on Appeal No. 2003-1345.
Saitoh, M., et al., "A newly developed electrical twisting ball display", Proceedings of the SID, 23, 249 (1982).
Sankus, "Electrophoretic Display Cell", Xerox Disclosure Journal, 6(3), 309 (1979).
Sheridon, N. K., et al., "A Photoconductor-Addressed Electrophoretic Cell for Office Data Display", SID 82 Digest, 94 (1982).
Sheridon, N.K., et al., "The Cyricon—A Twisting Ball Display", Proceedings of the SID, 18, 289 (1977).
Shiwa, S., et al., "Electrophoretic Display Method Using Ionographic Technology," SID 88 Digest (1988), p. 61.
Singer, B., et al., "An X-Y Addressable Electrophoretic Display," Proceedings of the SID, 18, 255 (1977).
Waltz, Administrative Patent Judge; Color Electrophoretic Displays; Jun. 17, 2004; 1-12; Decision on Appeal No. 2003-0784.
Webber, R., "Image Stability in Active-Matrix Microencapsulated Electrophoretic Displays", SID 02 Digest, 126 (2002).
White, R., "An Electrophoretic Bar Graph Display," Proceedings of the SID, 22, 173 (1981).
Whitesides, T. et al., "Towards Video-rate Microencapsulated Dual-Particle Electrophoretic Displays", SID 04 Digest, 133 (2004).
Wood, D., "An Electrochromic Renaissance?" Information Display, 18(3), 24 (Mar. 2002).

(56) References Cited

OTHER PUBLICATIONS

Yamaguchi, Y., et al., "Toner display using insulative particles charged triboelectrically", Asia Display/IDW '01, p. 1729, Paper AMD4-4 (2001).

Yang, Y., et al., "A new architecture for polymer transistors", Nature, 372, 344 (1994).

Zehner, R. et al., "Drive Waveforms for Active Matrix Electrophoretic Displays", SID 03 Digest, 842 (2003).

* cited by examiner

METHODS FOR ACHIEVING IMPROVED COLOR IN MICROENCAPSULATED ELECTROPHORETIC DEVICES

REFERENCE TO RELATED APPLICATIONS

This application is a continuation of copending application Ser. No. 10/817,464, filed Apr. 2, 2004 (Publication No. 2004/0190114, now U.S. Pat. No. 7,667,684), which is itself a continuation of application Ser. No. 09/349,806, filed Jul. 8, 1999 (Publication No. 2002/0113770—now abandoned), which itself claims priority to U.S. Ser. No. 60/092,050, filed Jul. 8, 1998. The contents of the aforementioned applications are incorporated herein by reference.

FIELD OF INVENTION

The present invention relates to electronic displays and, in particular, to full color electrophoretic displays and methods of manufacturing full-color microencapsulated electrophoretic displays.

BACKGROUND OF INVENTION

Electrophoretic display media are generally characterized by the movement of particles through an applied electric field. These displays are highly reflective, can be made bistable, can be scaled to large areas, and consume very little power. These properties allow encapsulated electrophoretic display media to be used in many applications for which traditional electronic displays are not suitable. While bichromatic electrophoretic displays have been demonstrated in a limited range of colors (e.g. black/white or yellow/red), to date there has not been successful commercialization of a full-color electrophoretic display. One reason for this failure of commercialization is the lack of a method of manufacture that is efficient and inexpensive.

One traditional technique for achieving a bright, full-color display which is known in the art of emissive displays is to create display elements that are red, green and blue. In this system, each element has two states: on, or the emission of color; and off. Since light blends from these elements, the overall display can take on a variety of colors and color combinations. In an emissive display, the visual result is the summation of the wavelengths emitted by the display elements at selected intensities, white is seen when red, green and blue are all active in balanced proportion. The brightness of the white image is controlled by the intensities of emission of light by the individual display elements. Black is seen when none are active or, equivalently, when all are emitting at zero intensity. As an additional example, a red visual display appears when the red display element is active while the green and blue are inactive, and thus only red light is emitted.

This method can be applied to bichromatic reflective displays, typically using the cyan-magenta-yellow subtractive color system. In this system, the reflective display elements absorb characteristic portions of the optical spectrum, rather than generating characteristic portions of the spectrum as do the elements in an emissive display. White reflects everything, or equivalently absorbs nothing. A colored reflective material reflects light corresponding in wavelength to the color seen, and absorbs the remainder of the wavelengths in the visible spectrum. To achieve a black display, all three display elements are turned on, and they absorb complementary portions of the spectrum.

However, such techniques require that the colored display elements be deposited onto a substrate in substantially equal proportions aligned with the proper addressing electrodes. Failure to achieve either substantially equal proportions of colored display elements or failure to achieve registration of the display elements with the addressing electrodes results in a color display that is unsatisfactory.

SUMMARY OF INVENTION

This invention teaches practical ways to efficiently and cheaply manufacture full-color, encapsulated electrophoretic displays. In one embodiment the display media can be printed and, therefore the display itself can be made inexpensively.

An encapsulated electrophoretic display can be constructed so that the optical state of the display is stable for some length of time. When the display has two states which are stable in this manner, the display is said to be bistable. If more than two states of the display are stable, then the display can be said to be multistable. For the purpose of this invention, the terms bistable and multistable, or generally, stable, will be used to indicate a display in which any optical state remains fixed once the addressing voltage is removed. The definition of a stable state depends on the application for the display. A slowly-decaying optical state can be effectively stable if the optical state is substantially unchanged over the required viewing time. For example, in a display which is updated every few minutes, a display image which is stable for hours or days is effectively bistable or multistable, as the case may be, for that application. In this invention, the terms bistable and multistable also indicate a display with an optical state sufficiently long-lived as to be effectively stable for the application in mind. Alternatively, it is possible to construct encapsulated electrophoretic displays in which the image decays quickly once the addressing voltage to the display is removed (i.e., the display is not bistable or multistable). As will be described, in some applications it is advantageous to use an encapsulated electrophoretic display which is not bistable or multistable. Whether or not an encapsulated electrophoretic display is stable, and its degree of stability, can be controlled through appropriate chemical modification of the electrophoretic particles, the suspending fluid, the capsule, binder materials, or addressing methods.

An encapsulated electrophoretic display may take many forms. The display may comprise capsules dispersed in a binder. The capsules may be of any size or shape. The capsules may, for example, be spherical and may have diameters in the millimeter range or the micron range, but is preferably from ten to a few hundred microns. The capsules may be formed by an encapsulation technique, as described below. Particles may be encapsulated in the capsules. The particles may be two or more different types of particles. The particles may be colored, luminescent, light-absorbing or transparent, for example. The particles may include neat pigments, dyed (laked) pigments or pigment/polymer composites, for example. The display may further comprise a suspending fluid in which the particles are dispersed.

The successful construction of an encapsulated electrophoretic display requires the proper interaction of several different types of materials and processes, such as a polymeric binder and, optionally, a capsule membrane. These materials must be chemically compatible with the electrophoretic particles and fluid, as well as with each other. The capsule materials may engage in useful surface interactions with the electrophoretic particles, or may act as a chemical or physical boundary between the fluid and the binder. Various materials and combinations of materials useful in constructing encapsulated electrophoretic displays are described in copending application Ser. No. 09/140,861, the contents of which are incorporated by reference herein.

In some cases, the encapsulation step of the process is not necessary, and the electrophoretic fluid may be directly dispersed or emulsified into the binder (or a precursor to the binder materials) and an effective "polymer-dispersed electrophoretic display" constructed. In such displays, voids created in the binder may be referred to as capsules or microcapsules even though no capsule membrane is present. The binder dispersed electrophoretic display may be of the emulsion or phase separation type.

Throughout the Specification, reference will be made to printing or printed. As used throughout the specification, printing is intended to include all forms of printing and coating, including: premetered coatings such as patch die coating, slot or extrusion coating, slide or cascade coating, and curtain coating; roll coating such as knife over roll coating, forward and reverse roll coating; gravure coating; dip coating; spray coating; meniscus coating; spin coating; brush coating; air knife coating; silk screen printing processes; electrostatic printing processes; thermal printing processes; lithographic printing processes; ink-jet printing processes and other similar techniques. A "printed element" refers to an element formed using any one of the above techniques.

As noted above, electrophoretic display elements can be encapsulated. Throughout the Specification, reference will be made to "capsules," "elements," and "display elements." A capsule or display element may itself comprise one or more capsules or other structures.

In one aspect the present invention relates to a method for manufacturing a color electrophoretic display. A substrate is provided having at least two electrodes. A first plurality of electrophoretic display elements are disposed on the substrate in substantial registration with one of the electrodes. The first plurality of electrophoretic display elements includes capsules containing a first species of particles suspended in a dispersing fluid and having a first optical property. A second plurality of electrophoretic display elements is disposed on the substrate in substantial registration with the other electrode. The second plurality of electrophoretic display elements includes capsules containing a second species of particles suspended in a dispersing fluid and having a second optical property.

In another aspect the present invention relates to a method for manufacturing a color electrophoretic display. A substrate is provided. A first plurality of electrophoretic display elements are disposed on the substrate. The first plurality of electrophoretic display elements includes capsules containing a first species of particles suspended in a dispersing fluid and having a first optical property. At least one electrode is deposited on the first plurality of electrophoretic display elements.

In still another aspect the present invention relates to a method for manufacturing a color electrophoretic display. A substrate is provided and at least two electrodes are deposited on the substrate. A first plurality of electrophoretic display elements are disposed on the substrate in substantial registration with one of the electrodes. The first plurality of electrophoretic display elements includes capsules containing a first species of particles suspended in a dispersing fluid and having a first optical property. A second plurality of electrophoretic display elements is disposed on the substrate in substantial registration with the other electrode. The second plurality of electrophoretic display elements includes capsules containing a second species of particles suspended in a dispersing fluid and having a second optical property.

In yet another aspect the present invention relates to a method for manufacturing a color electrophoretic display. A substrate is provided and a first plurality of electrophoretic display elements are disposed on the substrate. The first plurality of electrophoretic display elements includes capsules containing a first species of particles suspended in a dispersing fluid and having a first optical property. A second substrate is provided and at least one electrode is deposited on the second substrate. The first and second substrate are disposed adjacent each other so that the display elements are adjacent the electrode.

BRIEF DESCRIPTION OF DRAWINGS

The invention is pointed out with particularity in the appended claims. The advantages of the invention described above, together with further advantages, may be better understood by referring to the following description taken in conjunction with the accompanying drawings. In the drawings, like reference characters generally refer to the same parts throughout the different views. Also, the drawings are not necessarily to scale, emphasis instead generally being placed upon illustrating the principles of the invention.

DETAILED DESCRIPTION

Figure 1A:
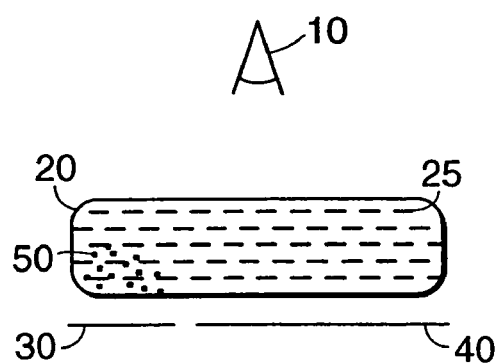
FIG. 1A is a diagrammatic side view of an embodiment of a rear-addressing electrode structure for a particle-based display in which a smaller electrode has been placed at a voltage relative to the large electrode causing the particles to migrate to the smaller electrode.

Electronic ink is an optoelectronically active material that comprises at least two phases: an electrophoretic contrast media phase and a coating/binding phase. The electrophoretic phase comprises, in some embodiments, a single species of electrophoretic particles dispersed in a clear or dyed medium, or more than one species of electrophoretic particles having distinct physical and electrical characteristics dispersed in a clear or dyed medium. In some embodiments the electrophoretic phase is encapsulated, that is, there is a capsule wall phase between the two phases. The coating/binding phase includes, in one embodiment, a polymer matrix that surrounds the electrophoretic phase. In this embodiment, the polymer in the polymeric binder is capable of being dried, crosslinked, or otherwise cured as in traditional inks, and therefore a printing process can be used to deposit the electronic ink onto a substrate.

In one embodiment, the ink may comprise display elements capable of displaying different colors. In one particular embodiment, some display elements contain red particles, some display elements contain green particles, and some display elements contain blue particles, respectively. In another particular embodiment, some display elements contain cyan particles, some display elements contain magenta particles, and some display elements contain yellow particles, respectively. By addressing each display element to display some fraction of its colored particles, a display can be caused to give an appearance corresponding to a selected color at a selected brightness level.

Electronic ink is capable of being printed by several different processes, depending on the mechanical properties of the specific ink employed. For example, the fragility or viscosity of a particular ink may result in a different process selection. A very viscous ink would not be well-suited to deposition by an inkjet printing process, while a fragile ink might not be used in a knife over roll coating process.

The optical quality of an electronic ink is quite distinct from other electronic display materials. The most notable difference is that the electronic ink provides a high degree of both reflectance and contrast because it is pigment based (as are ordinary printing inks). The light scattered from the electronic ink comes from a very thin layer of pigment close to the viewing surface. In this respect it resembles an ordinary, printed image. Also, electronic ink is easily viewed from a wide range of viewing angles in the same manner as a printed page, and such ink approximates a Lambertian contrast curve more closely than any other electronic display material. Since electronic ink can be printed, it can be included on the same surface with any other printed material, including traditional inks. Electronic ink can be made optically stable in all display configurations, that is, the ink can be set to a persistent optical state. Fabrication of a display by printing an electronic ink is particularly useful in low power applications because of this stability.

Electronic ink displays are novel in that they can be addressed by DC voltages and draw very little current. Therefore, elements forming electronic inks may be made of non-traditional materials and electronic inks may be manufactured by and used in non-traditional methods. As such, the conductive leads and electrodes used to deliver the voltage to electronic ink displays can be of relatively high resistivity. The ability to use resistive conductors substantially widens the number and type of materials that can be used as conductors in electronic ink displays. In particular, the use of costly vacuum-sputtered indium tin oxide (ITO) conductors, a standard material in liquid crystal devices, is not required. Aside from cost savings, the replacement of ITO with other materials can provide benefits in appearance, processing capabilities (printed conductors), flexibility, and durability. Additionally, the printed electrodes are in contact only with a solid binder, not with a fluid layer (like liquid crystals). This means that some conductive materials, which would otherwise dissolve or be degraded by contact with liquid crystals, can be used in an electronic ink application. These include opaque metallic inks for the rear electrode (e.g., silver and graphite inks), as well as conductive transparent inks for either substrate. These conductive coatings include semiconducting colloids, examples of which are indium tin oxide and antimony-doped tin oxide. Organic conductors (polymeric conductors and molecular organic conductors) also may be used. Polymers include, but are not limited to, polyaniline and derivatives, polythiophene and derivatives, poly3,4-ethylenedioxythiophene (PEDOT) and derivatives, polypyrrole and derivatives, and polyphenylenevinylene (PPV) and derivatives. Organic molecular conductors include, but are not limited to, derivatives of naphthalene, phthalocyanine, and pentacene. Polymer layers can be made thinner and more transparent than with traditional displays because conductivity requirements are not as stringent.

As an example, there is a class of materials called electroconductive powders which are also useful as coatable transparent conductors in electronic ink displays. One example is Zelec ECP electroconductive powders from DuPont Chemical Co. of Wilmington, Del.

It is possible to produce a wide gamut of colors from the superposition of suitable proportions of three properly chosen colors. In one embodiment, the colors red, green, and blue can be combined in various proportions to produce an image that is perceived as a selected color. Emissive or transmissive displays operate according to additive rules, where the perceived color is created by summing the emission wavelengths of a plurality of emitting or transmitting objects. For an emissive or transmissive display that includes three display elements, one of which can produce red light, one green light, and one blue light, respectively, one can generate a wide gamut of colors, as well as white and black. At one extreme, the combination of all three at full intensity is perceived as white, and at the other, the combination of all three at zero intensity is perceived as black. Specific combinations of controlled proportions of these three colors can be used to represent other colors.

In a reflective display, the light that a viewer perceives is the portion of the spectrum that is not absorbed when the light to be reflected falls on the reflector surface. One may thus consider a reflecting system as a subtractive system, that is, that each reflective surface "subtracts" from the light that portion which the reflector absorbs. The color of a reflector represents the wavelengths of light the reflector absorbs. A yellow reflector absorbs substantially blue light. A magenta reflector absorbs substantially green light. A cyan reflector absorbs substantially red light. Thus, in an alternative embodiment employing reflectors, nearly the same results as an emissive system can be obtained by use of the three colors cyan, yellow, and magenta as the primary colors, from which all other colors, including black but not white, can be derived. To obtain white from such a display, one must further introduce a third state per display element, namely white.

While the methods described discuss particles, any combination of dyes, liquids droplets and transparent regions that respond to electrophoretic effects could also be used. Particles of various optical effects may be combined in any suitable proportion. For example, certain colors may be over- or under-populated in the electrophoretic display, for example, by printing more display elements of one color than of another color, to account for the sensitivities of the human eye and to thereby achieve a more pleasing or uniform effect. Similarly, the sizes of the display elements may also be disproportionate to achieve various optical effects.

Although these examples describe microencapsulated electrophoretic displays, the invention can be utilized across other reflective displays including liquid crystal, polymer-dispersed liquid crystal, rotating ball, suspended particle and any other reflective display capable of being printed. In short, many schemes are possible by which display elements in a direct color reflective display can be printed. Such printing schemes will vary by the nature of the display and any suitable means may be used.

Figure 1B:
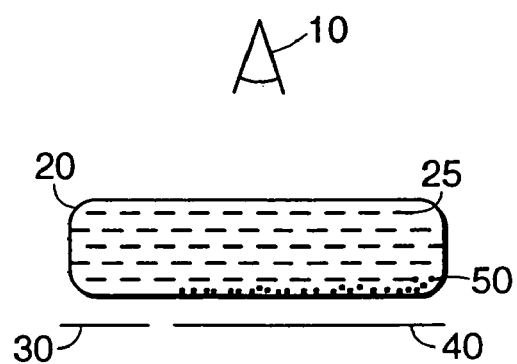
FIG. 1B is a diagrammatic side view of an embodiment of a rear-addressing electrode structure for a particle-based display in which the larger electrode has been placed at a voltage relative to the smaller electrode causing the particles to migrate to the larger electrode.

Referring now to FIGS. 1A and 1B, an addressing scheme for controlling particle-based displays is shown in which electrodes are disposed on only one side of a display, allowing the display to be rear-addressed. Utilizing only one side of the display for electrodes simplifies fabrication of displays. For example, if the electrodes are disposed on only the rear side of a display, both of the electrodes can be fabricated using opaque materials, which may be colored, because the electrodes do not need to be transparent.

FIG. 1A depicts a single capsule 20 of an encapsulated display media. In brief overview, the embodiment depicted in FIG. 1A includes a capsule 20 containing at least one particle 50 dispersed in a suspending fluid 25. The capsule 20 is addressed by a first electrode 30 and a second electrode 40. The first electrode 30 is smaller than the second electrode 40. The first electrode 30 and the second electrode 40 may be set to voltage potentials which affect the position of the particles 50 in the capsule 20.

The particles 50 represent 0.1% to 20% of the volume enclosed by the capsule 20. In some embodiments the particles 50 represent 2.5% to 17.5% of the volume enclosed by capsule 20. In preferred embodiments, the particles 50 represent 5% to 15% of the volume enclosed by the capsule 20. In more preferred embodiments the particles 50 represent 9% to 11% of the volume defined by the capsule 20. In general, the volume percentage of the capsule 20 that the particles 50 represent should be selected so that the particles 50 expose most of the second, larger electrode 40 when positioned over the first, smaller electrode 30. As described in detail below, the particles 50 may be colored any one of a number of colors. The particles 50 may be either positively charged or negatively charged.

The particles 50 are dispersed in a dispersing fluid 25. The dispersing fluid 25 should have a low dielectric constant. The fluid 25 may be clear, or substantially clear, so that the fluid 25 does not inhibit viewing the particles 50 and the electrodes 30, 40 from position 10. In other embodiments, the fluid 25 is dyed. In some embodiments the dispersing fluid 25 has a specific gravity substantially matched to the density of the particles 50. These embodiments can provide a bistable display media, because the particles 50 do not tend to move absent an electric field applied via the electrodes 30, 40.

Figure 1C:
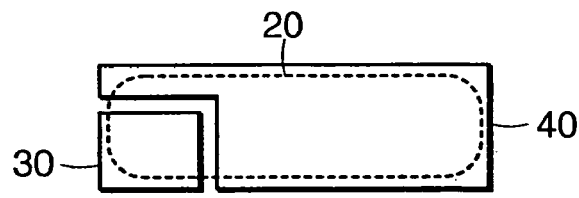
FIG. 1C is a diagrammatic top-down view of one embodiment of a rear-addressing electrode structure.

The electrodes 30, 40 should be sized and positioned appropriately so that together they address the entire capsule 20. There may be exactly one pair of electrodes 30, 40 per capsule 20, multiple pairs of electrodes 30, 40 per capsule 20, or a single pair of electrodes 30, 40 may span multiple capsules 20. In the embodiment shown in FIGS. 1A and 1B, the capsule 20 has a flattened, rectangular shape. In these embodiments, the electrodes 30, 40 should address most, or all, of the flattened surface area adjacent the electrodes 30, 40. The smaller electrode 30 is at most one half the size of the larger electrode 40. In preferred embodiments the smaller electrode is one quarter the size of the larger electrode 40; in more preferred embodiments the smaller electrode 30 is one eighth the size of the larger electrode 40. In even more preferred embodiments, the smaller electrode 30 is one sixteenth the size of the larger electrode 40. It should be noted that reference to "smaller" in connection with the electrode 30 means that the electrode 30 addresses a smaller amount of the surface area of the capsule 20, not necessarily that the electrode 30 is physically smaller than the larger electrode 40. For example, multiple capsules 20 may be positioned such that less of each capsule 20 is addressed by the "smaller" electrode 30, even though both electrodes 30, 40 are equal in size. It should also be noted that, as shown in FIG. 1C, electrode 30 may address only a small corner of a rectangular capsule 20 (shown in phantom view in FIG. 1C), requiring the larger electrode 40 to surround the smaller electrode 30 on two sides in order to properly address the capsule 20. Further, electrodes may be of any shape, such as concentric rings or rectangles. Selection of the percentage volume of the particles 50 and the electrodes 30, 40 in this manner allow the encapsulated display media to be addressed as described below.

Electrodes generally may be fabricated from any material capable of conducting electricity so that electrode 30, 40 may apply an electric field to the capsule 20. In the embodiments to be discussed here, conductive material may be printed by using conductive ink. Conductive inks are well known and may be prepared by including in the ink fluid a conductive material such as powdered metal or powdered graphite. As noted above, the rear-addressed embodiments depicted in FIGS. 1A and 1B allow the electrodes 30, 40 to be fabricated from opaque materials such as solder paste, copper, copper-clad polyimide, graphite inks, silver inks and other metal-containing conductive inks. Alternatively, electrodes may be fabricated using transparent materials such as indium tin oxide and conductive polymers such as polyaniline or polythiopenes. Electrodes 30, 40 may be provided with contrasting optical properties. In some embodiments, one of the electrodes has an optical property complementary to optical properties of the particles 50. Alternatively, since the electrodes need not be transparent, an electrode can be constructed so as to display a selected color. Since electric current is not always required to be conducted from an electrode to a display element, but is only required to flow within the electrode to set up an electric field, one is in general able to overcoat the electrode with a colored ink so as to impart a desired color to an electrode, without detrimental effect on the operation of an electrode.

The operation of the electrophoretic display element will be presented with regard to an embodiment that displays two states, for example, black and white. In this embodiment, the capsule 20 contains positively charged black particles 50, and a substantially clear suspending fluid 25. The first, smaller electrode 30 is colored black, and is smaller than the second electrode 40, which is colored white or is highly reflective. When the smaller, black electrode 30 is placed at a negative voltage potential relative to larger, white electrode 40, the positively charged particles 50 migrate to the smaller, black electrode 30. The effect to a viewer of the capsule 20 located at position 10 is a mixture of the larger, white electrode 40 and the smaller, black electrode 30, creating an effect which is largely white. Referring to FIG. 1B, when the smaller, black electrode 30 is placed at a positive voltage potential relative to the larger, white electrode 40, particles 50 migrate to the larger, white electrode 40 and the viewer is presented a mixture of the black particles 50 covering the larger, white electrode 40 and the smaller, black electrode 30, creating an effect which is largely black. In this manner the capsule 20 may be addressed to display either a white visual state or a black visual state.

Other two-color schemes are easily provided by varying the color of the smaller electrode 30 and the particles 50 or by varying the color of the larger electrode 40. For example, varying the color of the larger electrode 40 allows fabrication of a rear-addressed, two-color display having black as one of the colors. Alternatively, varying the color of the smaller electrode 30 and the particles 50 allow a rear-addressed two-color system to be fabricated using white as one of the colors. Further, it is contemplated that the particles 50 and the smaller electrode 30 can be different colors. In these embodiments, a two-color display may be fabricated having a second color that is different from the color of the smaller electrode 30 and the particles 50. For example, a rear-addressed, orange-white display may be fabricated by providing blue particles 50, a red, smaller electrode 30, and a white (or highly reflective) larger electrode 40. In general, the optical properties of the electrodes 30, 40 and the particles 50 can be independently selected to provide desired display characteristics. In some embodiments the optical properties of the dispersing fluid 25 may also be varied, e.g. the fluid 25 may be dyed.

Figure 1D:
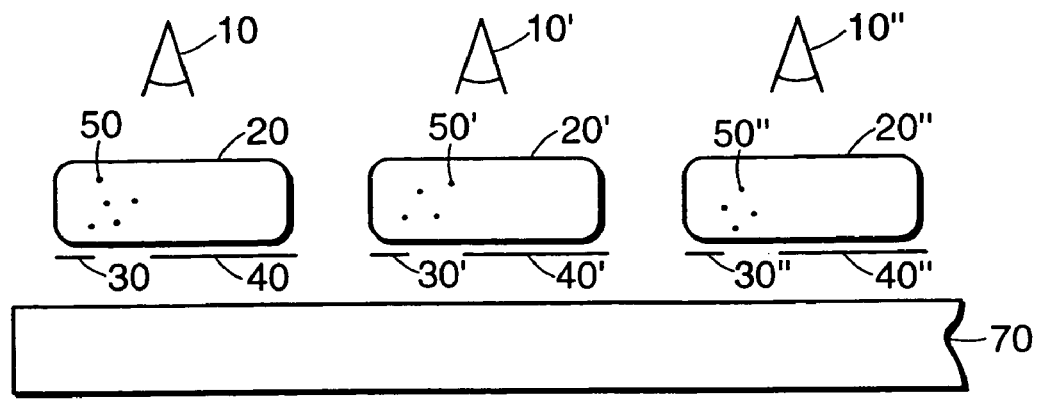
FIG. 1D is a diagrammatic side view of one embodiment of a display having three display elements, each display element being produced by a printing process.
Figure 1E:
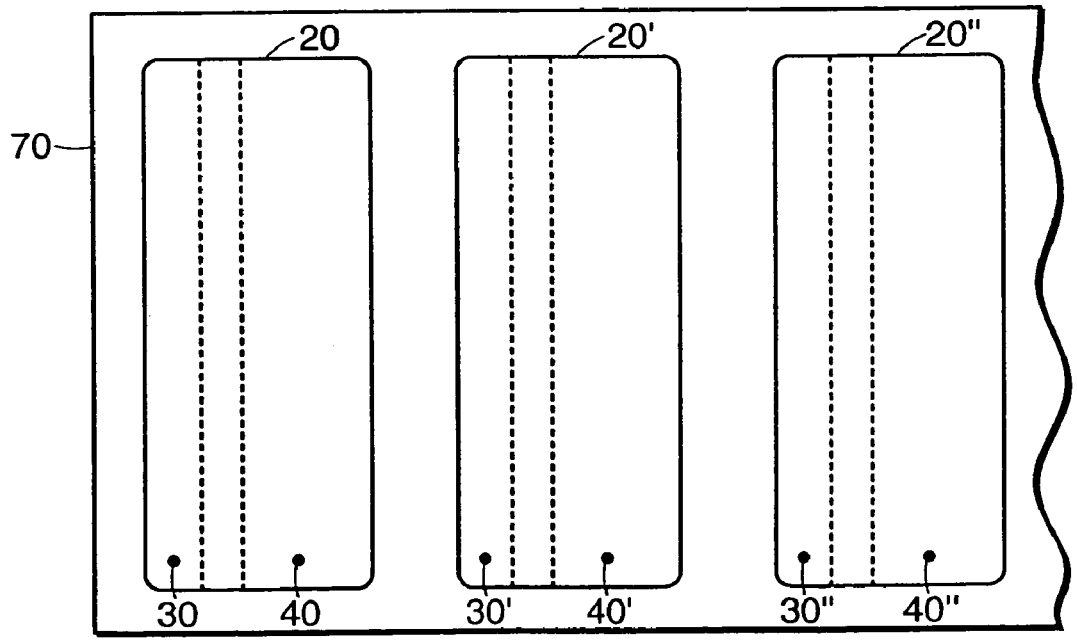
FIG. 1E is a diagrammatic plan view of one embodiment of a display having three display elements, each display element being produced by a printing process.
Figure 2:
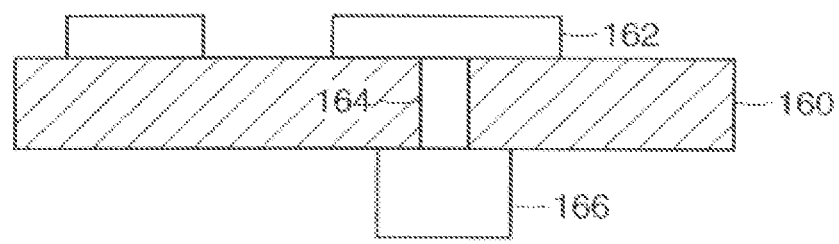
FIG. 2 is a cross-sectional view of a rear electrode addressing structure that is formed by printing.

In another embodiment, this technique may be used to provide a full color display. Referring now to FIGS. 1D and 1E, an embodiment is depicted that comprises three display elements. It should be understood that although FIGS. 1D and 1E depict rectangular elements having equally-sized display elements, an element may have any shape and a display may be comprised of display elements that are unequal in size or shape, or alternatively the display may be comprised of display elements that are unequal in number by color or optical property. The display elements may each be formed as a single large capsule, or each may be distributed across any number of small capsules or cells. For the purposes of illustration, the simpler case of a single large capsule for each display element is shown. In both cases we refer to the regions 20, 20', 20", as capsules. Thus, a first capsule 20 contains positively charged black particles 50 and a substantially clear suspending fluid 25. A first, smaller electrode 30 is colored black, and is smaller than the second electrode 40, which is colored red. When the smaller, black electrode 30 is placed at a negative voltage potential relative to larger, red electrode 40, the positively charged particles 50 migrate to the smaller, black electrode 30. The effect to a viewer of the capsule 20 located at position 10 is a mixture of the larger, red electrode 40 and the smaller, black electrode 30, creating an effect which is largely red. When the smaller, black electrode 30 is placed at a positive voltage potential relative to the larger, red electrode 40, particles 50 migrate to the larger, red electrode 40 and the viewer is presented a mixture of the black particles 50 covering the larger, red electrode 40 and the smaller, black electrode 30, creating an effect which is largely black. In this manner the first capsule 20 may be addressed to display either a red visual state or a black visual state. One can equally have a second capsule 20' wherein the larger electrode 40' is green, and a third capsule 20" wherein the larger electrode 40" is blue. A second capsule 20' contains positively charged black particles 50' and a substantially clear suspending fluid 25'. A first, smaller electrode 30' is colored black, and is smaller than the second electrode 40', which is colored green. When the smaller, black electrode 30' is placed at a negative voltage potential relative to larger, green electrode 40', the positively charged particles 50' migrate to the smaller, black electrode 30'. The effect to a viewer of the capsule 20' located at position 10' is a mixture of the larger, green electrode 40' and the smaller, black electrode 30', creating an effect which is largely green. When the smaller, black electrode 30' is placed at a positive voltage potential relative to the larger, green electrode 40', particles 50' migrate to the larger, green electrode 40' and the viewer is presented a mixture of the black particles 50' covering the larger, green electrode 40' and the smaller, black electrode 30', creating an effect which is largely black. Similarly, a third capsule 20" contains positively charged black particles 50" and a substantially clear suspending fluid 25". A first, smaller electrode 30" is colored black, and is smaller than the second electrode 40", which is colored blue. When the smaller, black electrode 30" is placed at a negative voltage potential relative to larger, blue electrode 40", the positively charged particles 50" migrate to the smaller, black electrode 30". The effect to a viewer of the capsule 20" located at position 10" is a mixture of the larger, blue electrode 40" and the smaller, black electrode 30", creating an effect which is largely blue. When the smaller, black electrode 30" is placed at a positive voltage potential relative to the larger, blue electrode 40", particles 50" migrate to the larger, blue electrode 40" and the viewer is presented a mixture of the black particles 50" covering the larger, blue electrode 40" and the smaller, black electrode 30", creating an effect which is largely black. Further, the relative intensities of these colors can be controlled by the actual voltage potentials applied to the electrodes. By choosing appropriate combinations of the three colors, one may create a visual display which appears as the effective combination of the selected colors as an additive process. As an alternative embodiment, the first, second and third capsules can have larger electrodes 40, 40', 40" which are respectively colored cyan, yellow, and magenta. Operation of the alternative cyan, yellow, and magenta embodiment is analogous to that of the red, green, and blue embodiment, with the feature that the color to be displayed is selected by a subtractive process.

In other embodiments the larger electrode 40 may be transparent or reflective instead of white. In these embodiments, when the particles 50 are moved to the smaller electrode 30, light reflects off the reflective surface of the larger electrode 40 and the capsule 20 appears light in color, e.g. white. When the particles 50 are moved to the larger electrode 40, the reflecting surface is obscured and the capsule 20 appears dark because light is absorbed by the particles 50 before reaching the reflecting surface. In other embodiments, proper switching of the particles may be accomplished with a combination of alternating-current (AC) and direct-current (DC) electric fields.

In still other embodiments, the rear-addressed display previously discussed can be configured to transition between largely transmissive and largely opaque modes of operation (referred to hereafter as "shutter mode"). Referring back to FIGS. 1A and 1B, in these embodiments the capsule 20 contains at least one positively-charged particle 50 dispersed in a substantially clear dispersing fluid 25. The larger electrode 40 is transparent and the smaller electrode 30 is opaque. When the smaller, opaque electrode 30 is placed at a negative voltage potential relative to the larger, transmissive electrode 40, the particles 50 migrate to the smaller, opaque electrode 30. The effect to a viewer of the capsule 20 located at position 10 is a mixture of the larger, transparent electrode 40 and the smaller, opaque electrode 30, creating an effect which is largely transparent. Referring to FIG. 1B, when the smaller, opaque electrode 30 is placed at a positive voltage potential relative to the larger, transparent electrode 40, particles 50 migrate to the second electrode 40 and the viewer is presented a mixture of the opaque particles 50 covering the larger, transparent electrode 40 and the smaller, opaque electrode 30, creating an effect which is largely opaque. In this manner, a display formed using the capsules depicted in FIGS. 1A and 1B may be switched between transmissive and opaque modes. In some embodiments the electrodes may be disposed on the viewing side of the capsule 20. Such a display can be used to construct a window that can be rendered opaque or a wide range of colors by using a tinted electrode. Although FIGS. 1A 1D depict a pair of electrodes associated with each capsule 20, it should be understood that each pair of electrodes may be associated with more than one capsule 20.

Figure 3A:
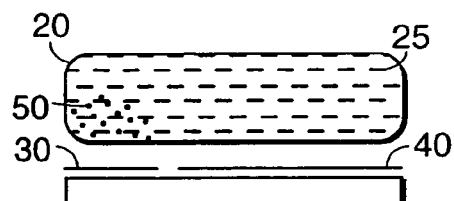
FIG. 3A is a schematic flow diagram of selected steps in a method of manufacturing a display that employs a process in which electrodes are first printed on a substrate, followed by the printing of display elements upon the electrodes.

A similar technique may be used in connection with the embodiment of FIGS. 3A, 3B, 3C, and 3D. Referring to FIG. 3A, a capsule 20 contains at least one dark or black particle 50 dispersed in a substantially clear dispersing fluid 25. A smaller, opaque electrode 30 and a larger, transparent electrode 40 apply both direct-current (DC) electric fields and alternating-current (AC) fields to the capsule 20. A DC field can be applied to the capsule 20 to cause the particles 50 to migrate towards the smaller electrode 30. For example, if the particles 50 are positively charged, the smaller electrode is placed a voltage that is more negative than the larger electrode 40. Although FIGS. 3A-3D depict only one capsule per electrode pair, multiple capsules may be addressed using the same electrode pair.

The smaller electrode 30 is at most one half the size of the larger electrode 40. In preferred embodiments the smaller electrode is one quarter the size of the larger electrode 40; in more preferred embodiments the smaller electrode 30 is one eighth the size of the larger electrode 40. In even more preferred embodiments, the smaller electrode 30 is one sixteenth the size of the larger electrode 40.

Causing the particles 50 to migrate to the smaller electrode 30, as depicted in FIG. 3A, allows incident light to pass through the larger, transparent electrode 40 and be reflected by a reflecting surface 60. In shutter mode, the reflecting surface 60 is replaced by a translucent layer, a transparent layer, or a layer is not provided at all, and incident light is allowed to pass through the capsule 20, i.e. the capsule 20 is transmissive. If the translucent layer or the transparent layer comprises a color, such as a color filter, the light that is transmitted will be those wavelengths that the filter passes, and the reflected light will consist of those wavelengths that the filter reflects, while the wavelengths that the filter absorbs will be lost. The visual appearance of a shutter mode display may thus depend on whether the display is in a transmissive or reflective condition, on the characteristics of the filter, and on the position of the viewer.

Figure 3B:
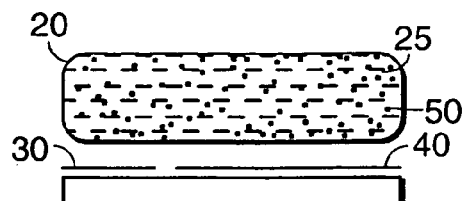
FIG. 3B is a schematic flow diagram of selected steps in a method of manufacturing a display that employs a process in which display elements are first printed on a substrate, followed by the printing of electrodes upon the display elements.

Referring now to FIG. 3B, the particles 50 are dispersed throughout the capsule 20 by applying an AC field to the capsule 20 via the electrodes 30, 40. The particles 50, dispersed into the capsule 20 by the AC field, block incident light from passing through the capsule 20, causing it to appear dark at the viewpoint 10. The embodiment depicted in FIGS. 3A 3B may be used in shutter mode by not providing the reflecting surface 60 and instead providing a translucent layer, a transparent layer, a color filter layer, or no layer at all. In shutter mode, application of an AC electric field causes the capsule 20 to appear opaque. The transparency of a shutter mode display formed by the apparatus depicted in FIGS. 3A-3D may be controlled by the number of capsules addressed using DC fields and AC fields. For example, a display in which every other capsule 20 is addressed using an AC field would appear about half as transmissive as when the particles are all addressed by the AC field.

Figure 3C:
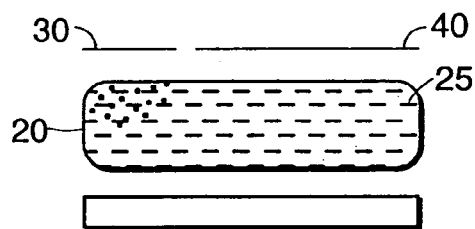
FIG. 3C is a schematic flow diagram of selected steps in a method of manufacturing a display that employs a process in which electrodes are printed on a first substrate, display elements are printed on a second substrate, and the two structures are combined to form a display.
Figure 3D:
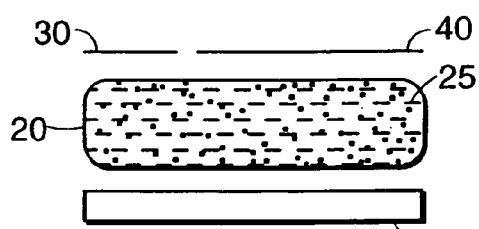
FIG. 3D is a diagrammatic side view of an embodiment of an addressing structure having transparent electrodes, in which an alternating-current electric field has been applied to the capsule causing the particles to disperse into the capsule.

FIGS. 3C and 3D depict an embodiment of the electrode structure described above in which electrodes 30, 40 are on "top" of the capsule 20, that is, the electrodes 30, 40 are between the viewpoint 10 and the capsule 20. In these embodiments, both electrodes 30, 40 should be transparent. Transparent conducting layers can be fabricated using conductive polymers, such as polyaniline, polythiophenes, indium tin oxide, or polymers containing conducting particles less than 100 nanometers in diameter such as copper iodide, ionic polymers, or slat-doped polymers. These materials may be made soluble so that electrodes can be fabricated using coating techniques such as spin coating, spray coating, meniscus coating, printing techniques, forward and reverse roll coating and the like. In these embodiments, light passes through the electrodes 30, 40 and is either absorbed by the particles 50, reflected by reflecting layer 60 (when provided), transmitted throughout the capsule 20 (when reflecting layer 60 is not provided), or partially transmitted and/or reflected if a color filter is present in place of retroreflecting layer 60.

Figure 3E:
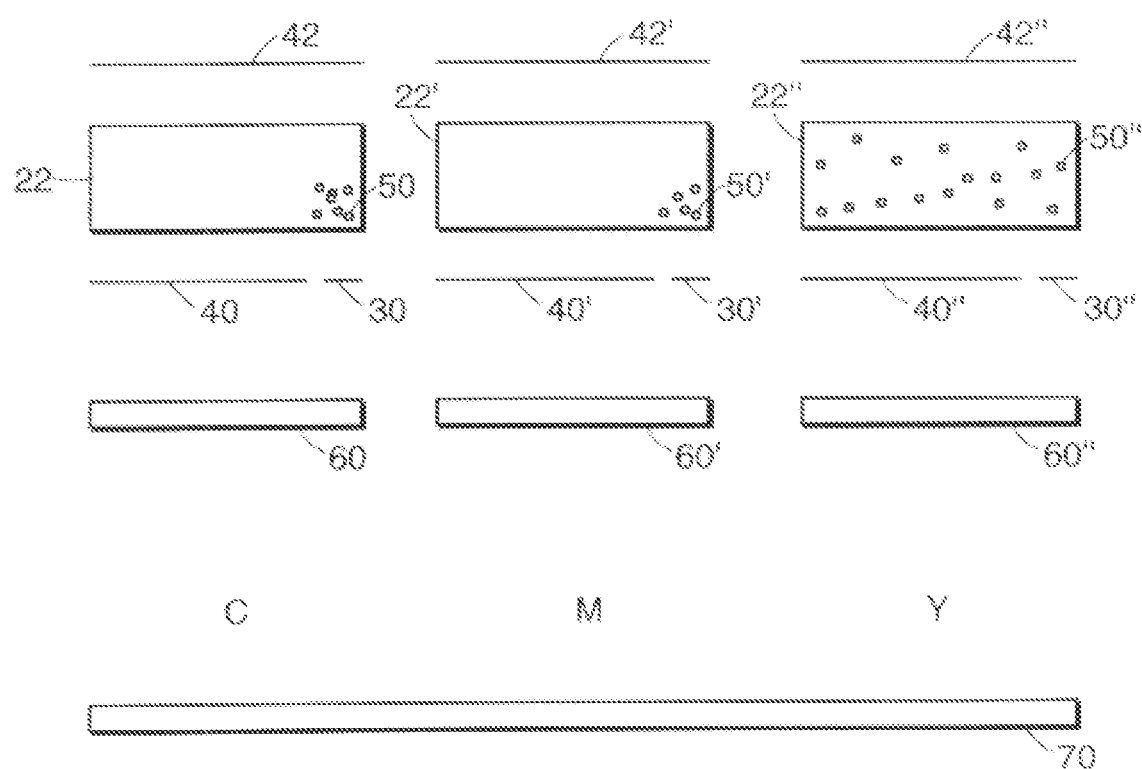
FIG. 3E is a diagrammatic side view of an embodiment of an addressing structure for a display element having three sub-pixels.

Referring to FIG. 3E, three display element capsules 22, 22' and 22" each contain at least one white particle 50 dispersed in a substantially clear dispersing fluid 25. In one embodiment, each display element capsule 22, 22' and 22" has a transparent electrode 42, 42', and 42" disposed above it and a colored filter 60, 60' and 60" disposed below it. A common reflective surface 70 may be shared behind the color filter layer. In an alternative embodiment, the display includes an emissive light source 70. Smaller, opaque electrodes 30, 30' and 30" and larger, transparent electrodes 40, 40' and 40" may apply direct-current (DC) electric fields and alternating-current (AC) fields to the capsules 20, 20' and 20". A DC field can be applied to the capsules 20, 20' and 20" to cause the particles 50, 50' 50" to migrate towards the smaller electrodes 30, 30' and 30". For example, if the particles 50, 50' and 50" are positively charged, the smaller electrodes 30, 30' and 30" are placed a voltage that is more negative than the larger electrodes 40, 40' and 40".

The smaller electrode 30 is at most one half the size of the larger electrode 40. In preferred embodiments the smaller electrode 30 is one quarter the size of the larger electrode 40; in more preferred embodiments the smaller electrode 30 is one eighth the size of the larger electrode 40. In even more preferred embodiments, the smaller electrode 30 is one sixteenth the size of the larger electrode 40.

Causing the particles 50 to migrate to the smaller electrode 30, as depicted in the first two capsules of FIG. 3E, allows incident light to pass through the larger, transparent electrode 40, through filter 60, reflect off substrate 70 and pass back through the device. If the first, second and third filters 60, 60' and 60" are colored cyan, magenta, and yellow respectively, and the particles 50 are white, this system can display full color in a standard two-color fashion.

The filter layer 60 may be a translucent layer, a transparent layer, a color filter layer, or a layer is not provided at all, and further substrate 70 may be reflective, emissive, translucent or not provided at all. If the layer 60 comprises a color, such as a color filter, the light which is transmitted will be those wavelengths that the filter passes, and the reflected light will consist of those wavelengths that the filter reflects, while the wavelengths that the filter absorbs will be lost. The visual appearance of a the display element in 3E may thus depend on whether the display is in a transmissive or reflective condition, on the characteristics of the filter, and on the position of the viewer. In an alternative embodiment layer 60 may be provided on top of the capsule adjacent to electrode 42.

Figure 3F:
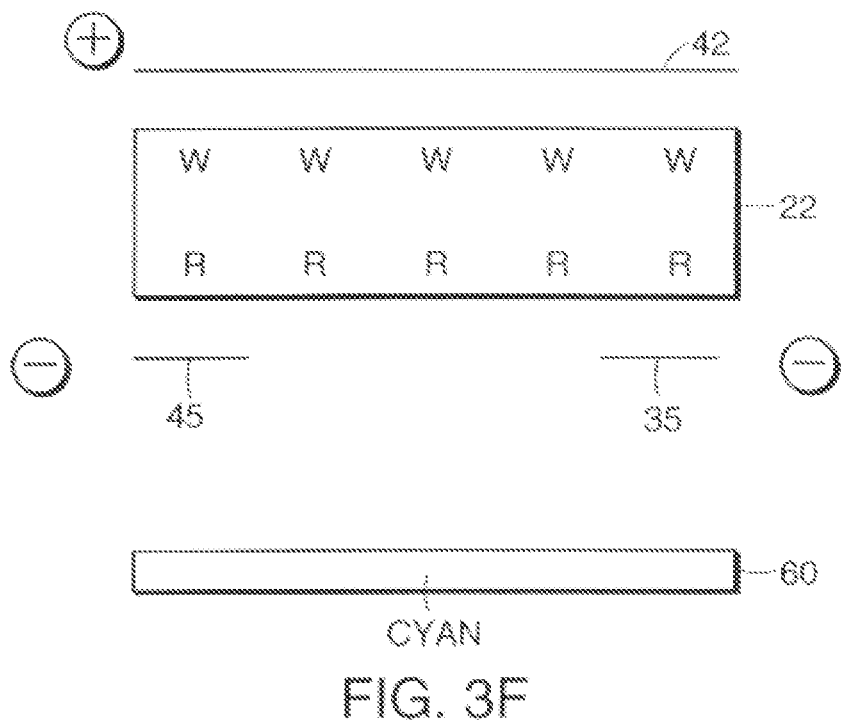
FIG. 3F is a diagrammatic side view of an embodiment of a dual particle curtain mode addressing structure addressing a display element to appear white.
Figure 3G:
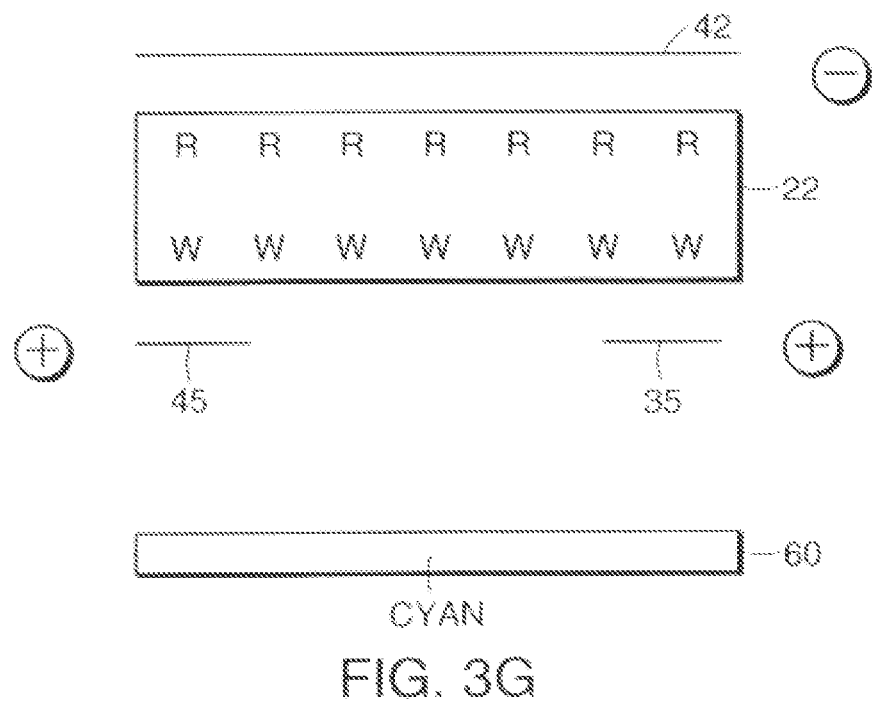
FIG. 3G is a diagrammatic side view of an embodiment of a dual particle curtain mode addressing structure addressing a display element to appear red.
Figure 3H:
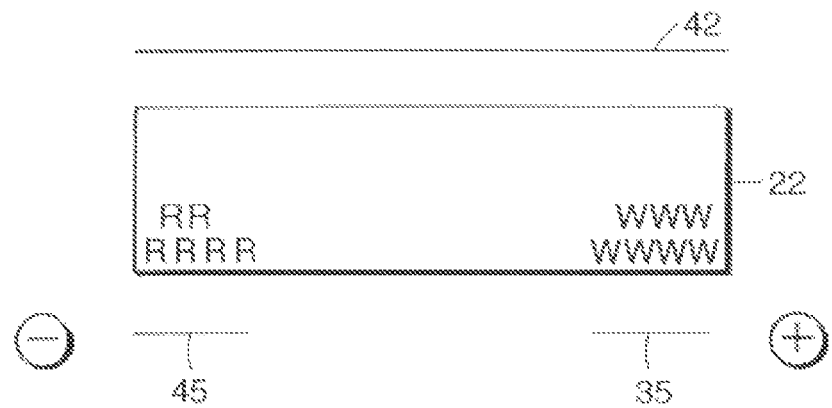
FIG. 3H is a diagrammatic side view of an embodiment of a dual particle curtain mode addressing structure addressing a display element to absorb red light.
Figure 3H:
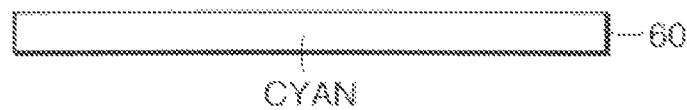

Referring now to FIGS. 3F-3K, one embodiment of a tri-color element is described. Clear electrode 42 allows light to pass into capsule 22 and to strike either white particles W, red particles R, or a colored substrate 60. The substrate 60 can be a combination of color filter and non-colored substrate or it can be provided as a unitary colored substrate. Capsule 22 also includes a suspending fluid that can be dye-colored (possibly eliminating the need for a separate color filter 60) or substantially clear. Electrodes 45 and 35 are transparent and may be equally sized or sized in any suitable manner taking into account the relative particles sizes and mobilities of particles W and R. A gap exists between 45 and 35. Assume that particles W are negatively charged and particles R are positively charged. In FIG. 3F, top electrode 42 is set at a positive voltage potential relative to bottom electrodes 35 and 45, moving particles W to the top and particles R to the bottom and thus white is displayed. In FIG. 3G by reversing the polarity of the electrodes, red is displayed. In both FIGS. 3F and 3G the particles obscure substrate 60. In FIG. 3H electrode 45 is at a negative voltage potential relative to electrode 35, while electrode 42 is at a voltage potential between the potentials of 45 and 35, such as zero. Alternatively, electrode 42 switches between the potentials of 45 and 35 so that over time the effective voltage of 42 is again between the potentials of 45 and 35. In this state, the particles R move toward electrode 45 and the particles W move toward electrode 35 and both particles R and W move away from the gap in the center of the capsule 22. This reveals substrate 60, permitting a third color such as cyan to be imaged. In alternate embodiments the color combinations can differ. The specific colors of the filters and particles need not differ. This system, called "dual particle curtain mode," can image three arbitrary colors. In a preferred embodiment the colors are as described wherein one color is white and the other two colors are complements. In this manner, referring again to FIG. 3H, if a small portion of red is visible it absorbs part of the light reflected from the cyan substrate and the net result is black, which may be offset by a small portion of visible white. Thus, the element in FIG. 3H may appear to be cyan even if some red and white is visible. As mentioned above, the edges of the element may be masked to hide particles R and W when in the mode shown in FIG. 3H.

Figure 3I:
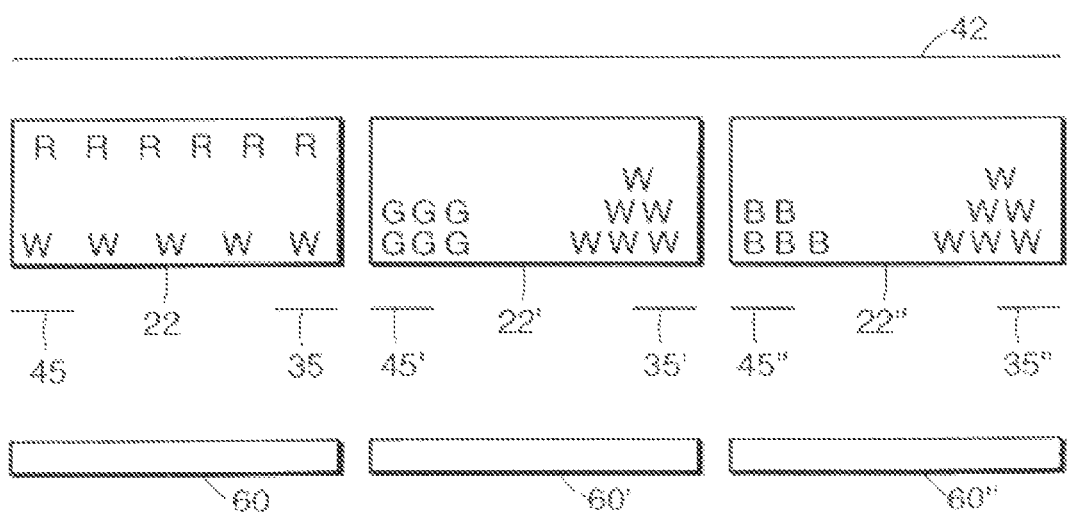
FIG. 3I is a diagrammatic side view of an embodiment of a dual particle curtain mode addressing structure for a display element having three sub-pixels, in which the display is addressed to appear red.

Referring now to FIG. 3I, a full-color element is shown comprising three display elements, each operating in the manner taught by FIGS. 3F-3H wherein the colored particles are positively charged, and the white particles are negatively charged. The system may still function with top electrode 42 extended as a common top electrode as shown in FIG. 3I. For example, to achieve the state shown, electrodes 42, 45, 35, 45', 35', 45", 35" may be set to voltage potentials −30V, 60V, 60V, −60V, +60V, −60V, +60V respectively.

Figure 3J:
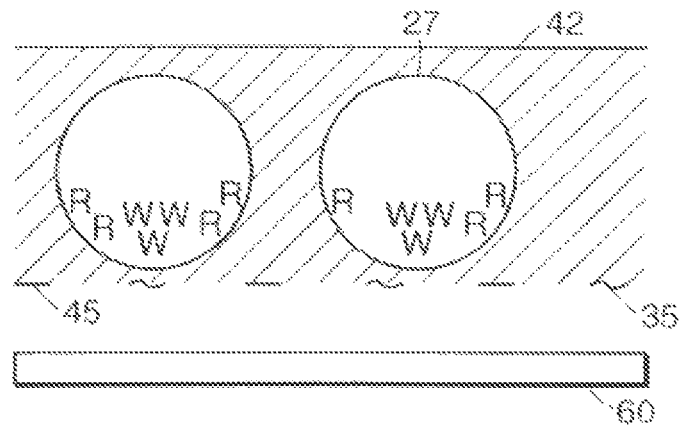
FIG. 3J is a diagrammatic side view of another embodiment of a dual particle curtain mode addressing structure for a display element.
Figure 3K:
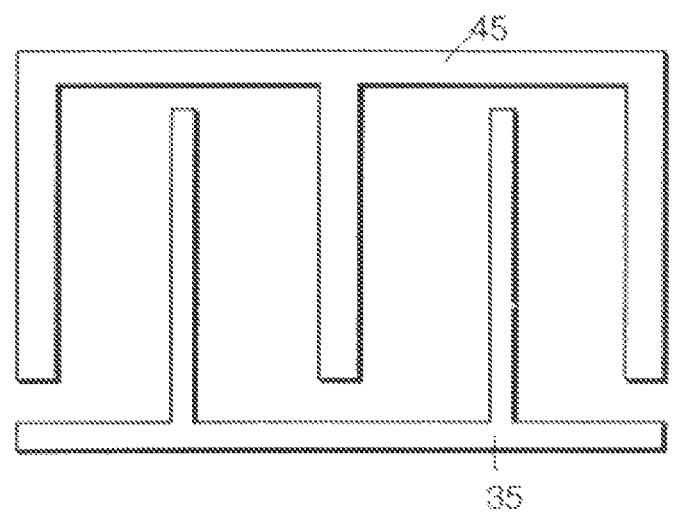
FIG. 3K is a diagrammatic plan view of an embodiment of an interdigitated electrode structure.

Referring now to FIGS. 3J-3K, an electrode scheme is shown whereby a cluster of microcapsules may be addressed for an entire display element in a manner similar to those described above. Clear electrode 42 allows light to pass into microcapsules 27 and to strike either white particles W, red particles R, or colored substrate 60. As above, colored substrate 60 may be a combination of color filter and non-colored substrate 60 or colored substrate 60 may be provided as a unitary colored substrate. Capsules 27 include a suspending fluid that may be dye-colored (possibly eliminating the need for a separate color filter 60) or substantially clear. Electrodes 45 and 35 are transparent and may be equally sized or sized in any suitable manner taking into account the relative particle sizes and mobilities of particles W and R. A gap exists between 45 and 35. Assume that particles W are negatively charged and particles R are positively charged. The system operates in the manner described in FIGS. 3F-3K, although for any given microcapsule 27 there may be multiple gaps. FIG. 3K illustrates an embodiment of a suitable electrode pattern in which 45 and 35 are interdigitated.

Figure 3L:
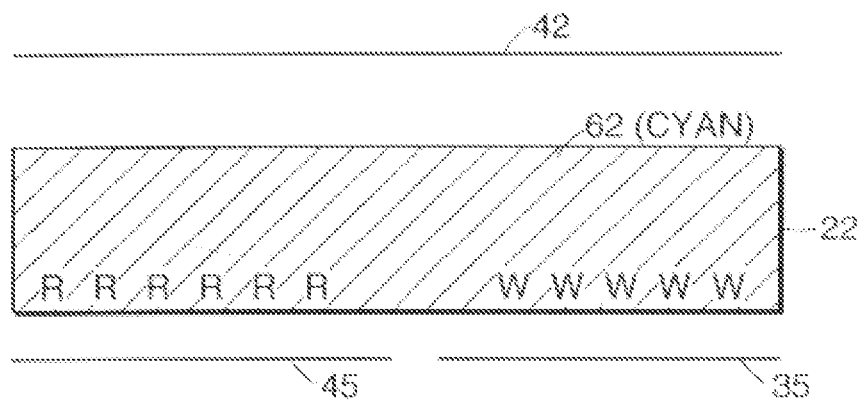
FIG. 3L is a diagrammatic side view of another embodiment of a dual particle curtain mode display structure having a dyed fluid and two species of particles, addressed to absorb red.
Figure 3M:
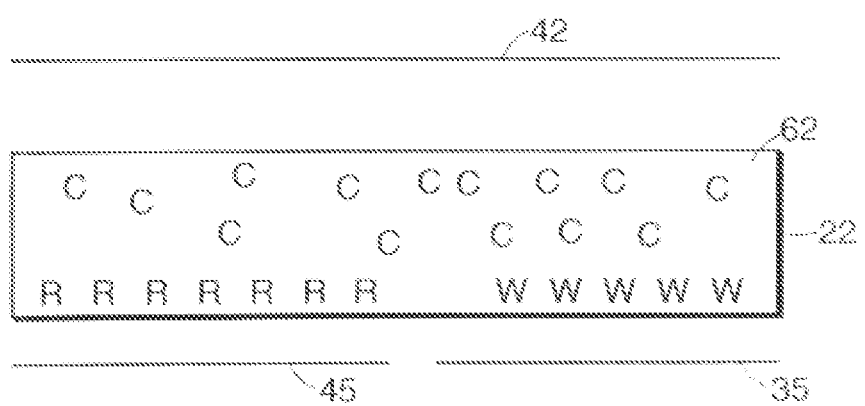
FIG. 3M is a diagrammatic side view of another embodiment of a dual particle curtain mode display structure having clear fluid and three species of particles, addressed to absorb red.

Referring now to FIGS. 3L-3M, an alternate embodiment is shown. Again clear electrode 42 allows light to pass into capsule 22 and to strike white particles W or red particles R. In the embodiment shown in FIG. 3L, capsule 22 includes a suspending fluid 62 that is dyed cyan. When electrodes 45 and 35 are set at appropriate voltages particles, R and W move down to electrodes 45 and 35 respectively, where they are obscured by light-absorbing suspending fluid 62. Alternatively, as shown in FIG. 3M, suspending fluid 62 is substantially clear and a third species of cyan particles C is included in capsules 22. The cyan particles have a relatively neutral charge. When electrodes 45 and 35 are set at appropriate voltages particles R and W move down to electrodes 45 and 35 respectively, revealing the cyan particles.

The addressing structure depicted in FIGS. 3A-3M may be used with electrophoretic display media and encapsulated electrophoretic display media. FIGS. 3A-3M depict embodiments in which electrode 30, 40 are statically attached to the display media. In certain embodiments, the particles 50 exhibit bistability, that is, they are substantially motionless in the absence of a electric field.

While various of the substrates described above are reflective, an analogous technique may be employed wherein the substrates emit light, with the particles again acting in a "shutter mode" to reveal or obscure light. A preferred substrate for this use is an electroluminescent (EL) backlight. Such a backlight can be reflective when inactive, often with a whitish-green color, yet emit lights in various wavelengths when active. By using whitish EL substrates in place of static white reflective substrates, it is possible to construct a full-color reflective display that can also switch its mode of operation to display a range of colors in an emissive state, permitting operation in low ambient light conditions.

Figure 4A:
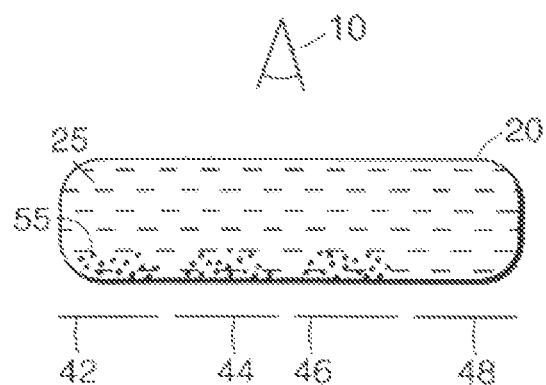
FIGS. 4A and 4B illustrate two different states of an embodiment of a rear-addressing electrode structure that creates a reflective color display in a manner similar to halftoning or pointillism.
Figure 4B:
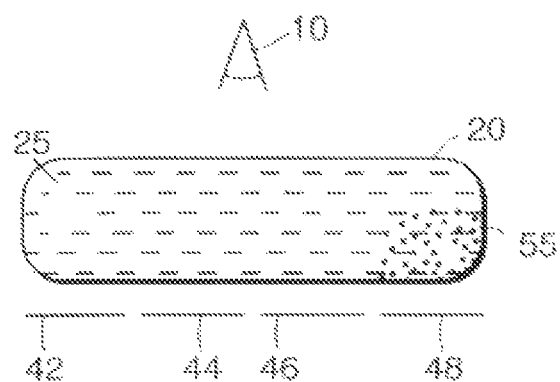

FIGS. 4A and 4B depict an embodiment of a rear-addressing electrode structure that creates a reflective color display in a manner similar to halftoning or pointillism. The capsule 20 contains white particles 55 dispersed in a clear suspending fluid 25. Electrodes 42, 44, 46, 48 are colored cyan, magenta, yellow, and white respectively. Referring to FIG. 4A, when the colored electrodes 42, 44, 46 are placed at a positive potential relative to the white electrode 48, negatively-charged particles 55 migrate to these three electrodes, causing the capsule 20 to present to the viewpoint 10 a mix of the white particles 55 and the white electrode 48, creating an effect which is largely white. Referring to FIG. 4B, when electrodes 42, 44, 46 are placed at a negative potential relative to electrode 48, particles 55 migrate to the white electrode 48, and the eye 10 sees a mix of the white particles 55, the cyan electrode 42, the magenta electrode 44, and the yellow electrode 46, creating an effect which is largely black or gray. By addressing the electrodes, any color can be produced that is possible with a subtractive color process. For example, to cause the capsule 20 to display a red color to the viewpoint 10, the yellow electrode 46 and the magenta electrode 42 are set to a voltage potential that is more positive than the voltage potential applied by the cyan electrode 42 and the white electrode 48. Further, the relative intensities of these colors can be controlled by the actual voltage potentials applied to the electrodes. Again, AC current may be used appropriately to randomize the position of the particles as a step in this process.

The technique used in FIGS. 4A and 4B could be used in a similar manner with fewer electrodes and controlling fewer colors. For example, if electrode 42 were not present, the element could still display three colors. If electrodes 44 and 46 were colored red and cyan respectively, the capsule could display red, cyan and white. This construction could be used then employed as a display element, to be matched with similar display elements displaying other trios of colors thus achieving a full-color display as described above.

The addressing structures described in FIGS. 1-4B typically comprise a top electrode controlled by display driver circuitry. It may be seen that if the top electrode is absent, the display may be imaged by an externally applied voltage source, such as a passing stylus or electrostatic print head. The means that techniques applied above to generate a full-color electrophoretic display could also be applied for a full-color electrophoretic media.

Figure 5:
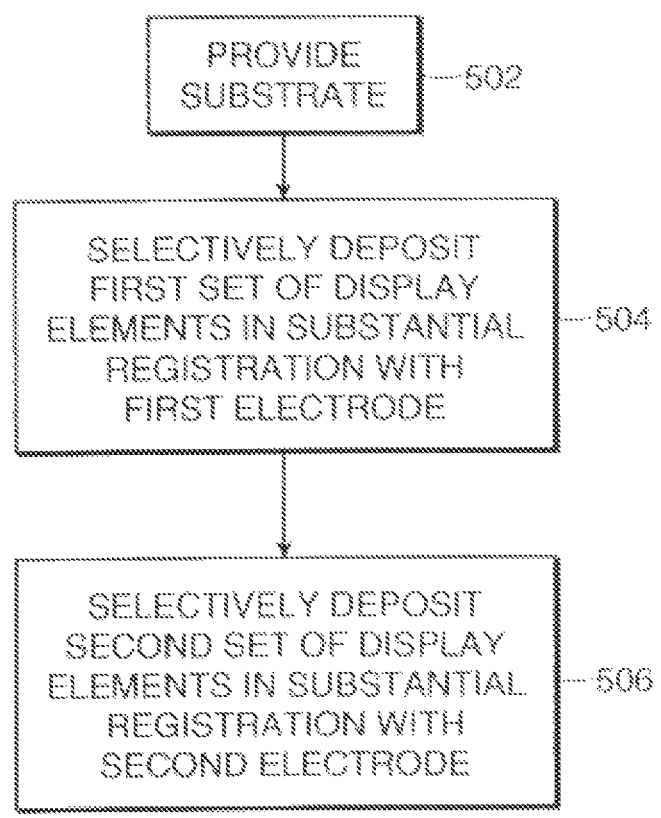
FIG. 5 is a flowchart showing the steps to be taken to fabricate a display using a method of the present invention.

As will be evident from the above discussion, color electrophoretic displays require careful registration of display elements to the electrodes used to address those display elements. Referring now to FIG. 5, steps that may be taken to efficiently and cheaply manufacture a display while avoiding the registration problems of prior art display are shown.

A substrate is provided that has at least two electrodes (step 502). The number of electrodes provided will vary depending on the number of regions to be individually addressed. For example, in a traditional RGB display, three electrodes or sets of electrodes may be provided in order to address red capsules, green capsules, and blue capsules. The electrodes may have a predetermined pattern of interest. For example, a display may include both electronic ink and traditional, printed inks. In such a display, the electrodes may be patterned to address only those portions of the display meant to bear electronic ink.

Figure 6:
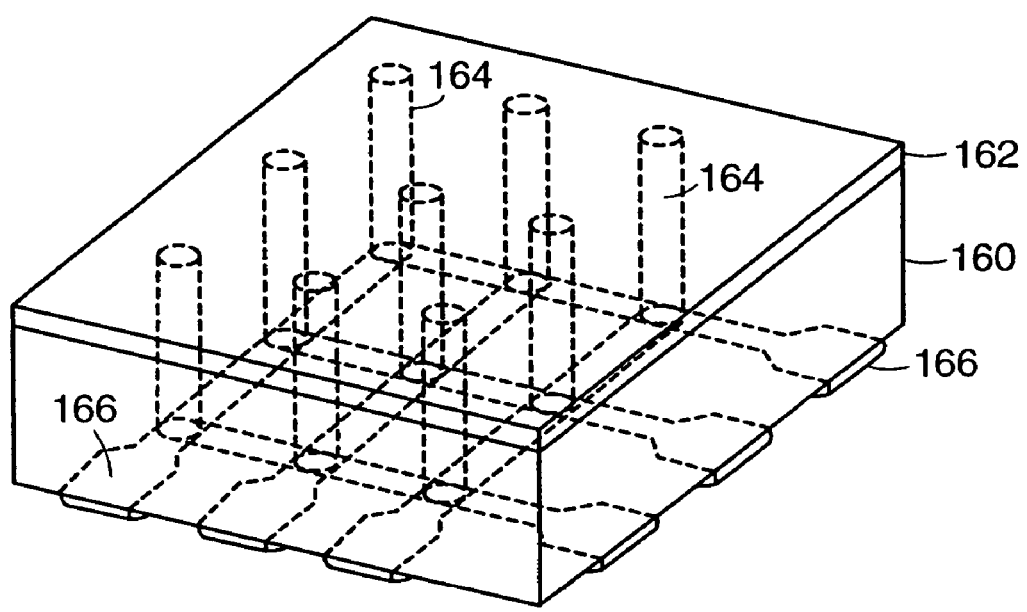
FIG. 6 is a three quarter view of a printed electrode produced by a process of the present invention.

In some embodiments, the substrate is provided and the electrodes are printed on the substrate using any one of a number of printing techniques. Referring now to FIG. 6, the structure of a printed electrode is shown. A conductive material 162 can be printed onto an insulative substrate 160. In some embodiments, such as the one shown in FIG. 6, the substrate 160 defines one or more vias 164 that allow the printed conductive material 162 to be driven by addressing logic 166. The addressing logic 166 may also be printed.

Referring back to FIG. 5, a first plurality of electrophoretic display elements is selectively printed on the substrate in substantial registration with at least one of the electrodes disposed on the substrate (step 504). The electrophoretic display elements generally are capsules containing one or more species of particles in a dispersing fluid as described above in connection with FIGS. 1-4B. The display elements, which may form the contrast phase of an electronic ink, may be printed onto the substrate using any of the printing techniques described above. In certain embodiments, the printing technique itself provides the accuracy necessary to register the display elements to the appropriate electrode. For example, an ink-jet printing process could be used to print red capsules in substantial registration with a "red" electrode, green capsules in substantial registration with a "green" electrode, and blue capsules in substantial registration with a "blue" electrode. The capsules can be printed sequentially or an ink-jet head may be used that allows red, green, and blue capsules to be simultaneously printed in a selective fashion.

In some embodiments, the display elements may be coated onto the substrate using an intermediate having a substantially cylindrical surface or a substantially flat surface, such as a lithographic belt. In specific embodiments, the intermediate is a roller, belt, blotter, brush, or sponge. The display elements may be held to the intermediate by electrostatic forces, surface tension, chemical bonding forces, or an applied electric field.

The properties of the binder phase can be adjusted to match the desired printing process. For example, an ink to be used in inkjet printing may be adjusted to have a low viscosity. An ink suitable for lithographic printing may be adjusted to have a suitable contact angle. The display elements can be dispersed in a suitable carrier fluid such as water or an organic solvent that is dried after coating. The carrier fluid can also contain agents to modify surface tension, contact angle, viscosity, or electrical conductivity. The binder phase may contain monomers, oligomers, polymers, or polymerization inhibitors. These components can be used to form physically robust display element layers.

In one embodiment the display elements could be dispersed in a low viscosity water solution containing a polymer. This solution could be inkjet printed in registration with the appropriate electrode pattern. In another embodiment the display element can be dispersed in an ultraviolet-curable resin used in lithographic printing processes, deposited on the appropriate electrodes by a lithographic process, and cured to form the display element layer. In all cases, the display elements are printed in substantial registration with the appropriate electrodes.

In other embodiments, the electronic ink is coated onto the substrate using an appropriate coating method such as knife-over-roll coating, silk-screen printing processes, brushing or other non-patterned coating techniques. In these embodiments, an electric signal is applied to the electrode to which the display elements should be registered. Application of an electric signal attracts the display elements proximate the electrode. For certain embodiments employing a carrier, the applied signal overcomes the forces holding the display elements to the carrier and transfers the elements to the substrate adjacent the electrode. The display elements can be dispersed in a low viscosity liquid, such as low molecular weight hydrocarbons like methylethylketone or cyclohexane, or alcohols such as ethanol or propanol. The display elements are then treated to produce a controlled surface charge by, for example, adjusting the pH of the dispersing liquid or adding surface active agents such as soaps, detergents, or other dispersants. Because the charge of the display elements is controlled, an electric charge can be use to transfer the display elements to the appropriate electrode.

Other display elements may then be removed from the substrate, e.g. by washing the substrate, to leave only the display elements that are proximate to the electrode. A second plurality of electrophoretic display elements are selectively deposited on the substrate in substantial registration with another electrode (step 506) using techniques similar to those just described. The technique used to selectively deposit the first plurality of display elements need not be the same technique as that used to selectively deposit the second plurality of display elements.

This technique for printing displays can be used to build the rear electrode structure on a display or to construct two separate layers that are laminated together to form the display. For example an electronically active ink may be printed on an indium tin oxide electrode. Separately, a rear electrode structure as described above can be printed on a suitable substrate, such as plastic, polymer films, or glass. The electrode structure and the display element can be laminated to form a display.

While the examples described here are listed using encapsulated electrophoretic displays, there are other particle-based display media which should also work as well, including encapsulated suspended particles and rotating ball displays.

While the invention has been particularly shown and described with reference to specific preferred embodiments, it should be understood by those skilled in the art that various changes in form and detail may be made therein without departing from the spirit and scope of the invention as defined by the appended claims.

The invention claimed is:

1. A method of manufacturing a color electrophoretic display comprising the steps of:
   (a) providing a substrate having at least two electrodes disposed thereon;
   (b) selectively depositing a first plurality of electrophoretic display elements in substantial registration with a first electrode, each of said first plurality of display elements comprising a capsule containing a plurality of a first species of particles, said first species of particles responsive to a first applied electric field and having a first optical property; and
   (c) selectively depositing a second plurality of electrophoretic display elements in substantial registration with a second electrode, each of said second plurality of display elements comprising a capsule containing a plurality of a second species of particles, said second species of particles responsive to a second applied electric field and having a second optical property.

2. The method of claim 1, wherein step (a) comprises the step of: providing a substrate having at least two electrodes disposed thereon, at least one of said at least two electrodes having a pre-determined pattern.

3. The method of claim 1, wherein step (b) comprises:
   (b-a) providing a carrier bearing a first plurality of electrophoretic display elements, each of said first plurality of display elements comprising a capsule containing a plurality of a first species of particles, said first species of particles responsive to a first applied electric field and having a first optical property;
   (b-b) disposing said carrier adjacent said substrate; and
   (b-c) applying an electrical signal to said at least one electrode to transfer at least some of said first plurality of electrophoretic display elements from said carrier to said substrate in substantial registration with said at least one electrode.

4. The method of claim 3, wherein step (b-a) comprises providing a carrier bearing a first plurality of electrophoretic display elements, each of said first plurality of display elements comprising a capsule containing a plurality of a first species of particles and a dyed fluid, said first species of particles responsive to a first applied electric field and having a first optical property.

5. The method of claim 3, wherein said first plurality of electrophoretic display elements is held upon said carrier by an applied electric field.

6. The method of claim 3, wherein said first plurality of electrophoretic display elements is held upon said carrier by electrostatic forces.

7. The method of claim 3, wherein said first plurality of electrophoretic display elements is held upon said carrier by chemical bonding forces.

8. The method of claim 3, wherein said first plurality of electrophoretic display elements is held upon said carrier by surface tension.

9. The method of claim 3, wherein step (b-a) comprises providing a carrier having a substantially flat surface, and bearing a first plurality of electrophoretic display elements, each of said first plurality of display elements comprising a capsule containing a plurality of a first species of particles, said first species of particles responsive to a first applied electric field and having a first optical property.

10. The method of claim 3, wherein step (b-a) comprises providing a carrier having a substantially cylindrical surface, and bearing a first plurality of display electrophoretic elements, each of said first plurality of display elements comprising a capsule containing a plurality of a first species of particles, said first species of particles responsive to a first applied electric field and having a first optical property.

11. The method of claim 3, wherein step (b-a) comprises providing a carrier that is a fluid, bearing a first plurality of electrophoretic display elements, each of said first plurality of display elements comprising a capsule containing a plurality of a first species of particles, said first species of particles responsive to a first applied electric field and having a first optical property.

12. A method of manufacturing an electrophoretic display comprising the steps of:
   (a) providing a substrate;
   (b) selectively depositing upon said substrate at least two electrodes;
   (c) selectively depositing a first plurality of electrophoretic display elements in substantial registration with a first electrode, each of said first plurality of display elements comprising a capsule containing a plurality of a first species of particles, said first species of particles responsive to a first applied electric field and having a first optical property; and
   (d) selectively depositing a second plurality of electrophoretic display elements in substantial registration with a second electrode, each of said second plurality of display elements comprising a capsule containing a plurality of a second species of particles, said second species of particles responsive to a second applied electric field and having a second optical property.

13. The method of claim 12, wherein step (b) comprises selectively depositing in a pre-determined pattern upon said substrate at least two electrodes.

14. The method of claim 13, wherein step (c) comprises selectively depositing upon, and in substantial registration with, a first electrode a first plurality of electrophoretic display elements, each of said first plurality of display elements comprising a capsule containing a plurality of a first species of particles, said first species of particles responsive to a first applied electric field and having a first optical property.

* * * * *